US008686469B2

(12) United States Patent
Nakamura

(10) Patent No.: US 8,686,469 B2
(45) Date of Patent: Apr. 1, 2014

(54) SEMICONDUCTOR DEVICE

(75) Inventor: Katsumi Nakamura, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 183 days.

(21) Appl. No.: 13/093,397

(22) Filed: Apr. 25, 2011

(65) Prior Publication Data

US 2011/0291223 A1 Dec. 1, 2011

(30) Foreign Application Priority Data

May 26, 2010 (JP) ................................. 2010-120180
Feb. 3, 2011 (JP) ................................. 2011-021828

(51) Int. Cl.
*H01L 29/02* (2006.01)

(52) U.S. Cl.
USPC ..... 257/143; 257/401; 257/502; 257/E29.197

(58) Field of Classification Search
None
See application file for complete search history.

(56) References Cited

U.S. PATENT DOCUMENTS

| 5,360,984 | A | * | 11/1994 | Kirihata | ......................... | 257/143 |
| 7,470,952 | B2 | | 12/2008 | Ruething et al. | | |
| 2006/0170075 | A1 | * | 8/2006 | Takahashi | ...................... | 257/580 |
| 2009/0242931 | A1 | * | 10/2009 | Tsuzuki et al. | ................ | 257/143 |
| 2009/0289276 | A1 | | 11/2009 | Yoshiura et al. | | |

FOREIGN PATENT DOCUMENTS

| CN | 1819260 A | 8/2006 |
| CN | 101587912 A | 11/2009 |
| DE | 196 11 689 A1 | 1/1997 |
| DE | 10 2006 002 439 A1 | 8/2006 |
| DE | 10 2006 025 958 B3 | 10/2007 |
| DE | 10 2008 051 166 A1 | 12/2009 |
| DE | 10 2010 028 978 A1 | 12/2010 |
| JP | 2009-267394 A | 11/2009 |
| JP | 2009-283781 | 12/2009 |
| KR | 10-2005-0012175 | 1/2005 |
| KR | 10-2006-0087413 A | 8/2006 |
| KR | 10-2011-0127232 | 11/2011 |

OTHER PUBLICATIONS

Josef Lutz et al., "Dynamic avalanche and reliability of high voltage diodes," Microelectronics Reliability 43, 2003, pp. 529-536.

(Continued)

*Primary Examiner* — Tan N Tran
*Assistant Examiner* — Scott R Wilson
(74) *Attorney, Agent, or Firm* — Oblon, Spivak, McClelland, Maier & Neustadt, L.L.P.

(57) ABSTRACT

A semiconductor device includes a semiconductor substrate having a diode active region and an edge termination region adjacent to each other, a first region of a first conductivity type in the diode active region, a second region of a second conductivity type, a third region of the first conductivity type in the edge termination region, and a fourth region of the second conductivity type. The first region and the third region share a drift region of the first conductivity type. The first region and the third region share a fifth region of the first conductivity type. The drift region in the third region is greater in number of crystal defects per unit volume than the drift region in the first region in order that the drift region in the third region is shorter in carrier lifetime than the drift region in the first region.

12 Claims, 39 Drawing Sheets

(56) References Cited

OTHER PUBLICATIONS

Satoru Kameyama et al., "Investigation of Dynamic Avalanche in the Termination Region for FWDs with High Reverse Recovery Capability," Proceedings of the 20$^{th}$ International Symposium on Power Semiconductor Devices & IC's, May 18-22, 2008, pp. 137-140.

Office Action issued Aug. 1, 2012, in Korean Patent Application No. 10-2011-0047223 with English translation.

Notice of Allowance issued Jun. 14, 2013 in Korean Application No. 10-2011-0047223 (With English Translation).

Office Action mailed Mar. 28, 2013, in Chinese Application No. 201110150632.2 (with English translation).

Office Action issued Jun. 21, 2013 in German Patent Application No. 10 2011 076 243.4 (with English language translation).

Office Action issued Jul. 10, 2013 in Korean Patent Application No. 10-2013-0066032 (with English language translation).

Office Action mailed Aug. 23, 2013 in Taiwanese Application No. 100112417 (w/English translation).

* cited by examiner

SEMICONDUCTOR DEVICE

BACKGROUND OF THE INVENTION

1. Field of the Invention

The present invention relates to a semiconductor device, and particularly to a power semiconductor device of high breakdown voltage provided with a diode.

2. Description of the Background Art

An example of the power semiconductor device may include a power module of high breakdown voltage that can withstand a voltage, for example, greater than or equal to 600V. Such a power module may be equipped with an IGBT and a diode.

For example, Japanese Patent Laying-Open No. 2009-283781 discloses a semiconductor device provided with a diode, in which an n-type semiconductor substrate has an anode formed on one main surface and a cathode formed on the other main surface. The anode is a p-type diffusion region and the cathode is formed of an n-type super-high concentration impurity layer and an n-type high concentration impurity layer. A guard ring is formed so as to surround this anode. A p-type diffusion region on the cathode side is formed in the region of the cathode facing the guard ring.

When a voltage in the forward direction is applied between the anode electrode and the cathode electrode of the above-described semiconductor device, the diode is brought into an ON state. In this state, a plurality of carriers are accumulated within the semiconductor substrate (drift layer). In other words, holes are injected from a p-type diffusion region into a drift layer, while electrons are injected from an n-type high concentration impurity layer or the like into the drift layer. In contrast, when a voltage in the reverse direction is applied between the anode electrode and the cathode electrode, the diode is brought into an OFF state. In this state, the electrons and the holes in the carriers accumulated in the drift layer are discharged from the cathode electrode and the anode electrode, respectively.

In this OFF state, since a p-type diffusion region is formed on the cathode side, the volume of the n-type region on the cathode side is decreased. This allows reduction of the current concentration in the outer peripheral end of the anode in the OFF state. In other words, the current concentration is reduced in the region in the vicinity of the guard ring in the OFF state, which causes an increase in the breakdown voltage in this region.

However, in the semiconductor device disclosed in Japanese Patent Laying-Open No. 2009-283781, the current in the forward direction may decrease which flows through the main region in the diode (drift layer sandwiched between the anode and the cathode) in the ON state. This causes a decrease in the density of carriers accumulated in the drift layer in the ON state, which may result in a decrease in the amount of the current that should essentially flow into the diode.

The present invention has been made in view of the above-described problems. An object of the present invention is to provide a semiconductor device which prevents rise and drop of the voltage in the forward direction flowing through the diode and allows an increase in the breakdown voltage in the vicinity of the edge termination region such as a guard ring during the recovery operation in which the diode is switched from the ON state to the OFF state.

SUMMARY OF THE INVENTION

A semiconductor device according to an aspect of the present invention includes a semiconductor substrate, a first region of a first conductivity type, a second region of a second conductivity type, a third region of the first conductivity type, and a fourth region of the second conductivity type. The semiconductor substrate has a first main surface and a second main surface facing each other, and a diode active region and an edge termination region adjacent to each other. The first region is formed in the diode active region and within the semiconductor substrate. The second region is formed on the first main surface of the semiconductor substrate to form a diode together with the first region in the diode active region. The third region is formed in the edge termination region and within the semiconductor substrate. The fourth region corresponds to a region serving as an edge termination formed on the first main surface of the semiconductor substrate in the edge termination region. The first region and the third region share a drift region of the first conductivity type forming a pn junction with the fourth region. The first region and the third region are located on the second main surface and share a fifth region of the first conductivity type which is higher in concentration of first conductivity type impurities than the drift region. The drift region in the third region is greater in number of crystal defects per unit volume than the drift region in the first region in order that the drift region in the third region is shorter in carrier lifetime than the drift region in the first region.

The semiconductor device according to another aspect of the present invention includes a semiconductor substrate, a first region of a first conductivity type, a second region of a second conductivity type, a third region of the first conductivity type, and a fourth region of the second conductivity type. The semiconductor substrate has a first main surface and a second main surface facing each other, and a diode active region and an edge termination region adjacent to each other. The first region is formed in the diode active region and within the semiconductor substrate. The second region is formed on the first main surface of the semiconductor substrate to form a diode together with the first region in the diode active region. The third region is formed in the edge termination region and within the semiconductor substrate. The fourth region corresponds to a region serving as an edge termination formed on the first main surface of the semiconductor substrate in the edge termination region. The first region and the third region share a drift region of the first conductivity type forming a pn junction with the fourth region. The first region has a fifth region of the first conductivity type which is higher in concentration of first conductivity type impurities than the drift region. The edge termination region has the drift region formed on the second main surface and the diode active region has the fifth region formed on the second main surface.

The semiconductor device according to still another aspect of the present invention includes a semiconductor substrate, a first region of a first conductivity type, a second region of a second conductivity type, a third region of the first conductivity type, and a fourth region of the second conductivity type. The semiconductor substrate has a first main surface and a second main surface facing each other, and a diode active region and an edge termination region adjacent to each other. The first region is formed in the diode active region and within the semiconductor substrate. The second region is formed on the first main surface of the semiconductor substrate to form a diode together with the first region in the diode active region. The third region is formed in the edge termination region and within the semiconductor substrate. The fourth region corresponds to a region serving as an edge termination formed on the first main surface of the semiconductor substrate in the edge termination region. The first region and the third region share a drift region of the first conductivity type forming a pn junction with the fourth region. The first region has a fifth region of the first conductivity type which is higher in concentration of first conductivity type impurities than the drift region. The semiconductor device further includes a first reverse conductivity type region of the second conductivity type formed adjacent to the fifth region on the second main surface of the diode active region; and a second reverse conductivity type region of the second conductivity type formed on the second main surface of the edge termination region. The first region and the third region share a sixth region of the first conductivity type which is lower in concentration of the first conductivity type impurities than the fifth region and higher in concentration of the first conductivity type impurities than the drift region. The sixth region is located between the drift region and the fifth region, the first reverse conductivity type region in the diode active region and located between the second reverse conductivity type region and the drift region in the edge termination region. A region of the sixth region located directly above the fifth region is different in concentration of the first conductivity type impurities from a region of the sixth region located directly above the first reverse conductivity type region.

According to the semiconductor device of one aspect of the present invention, while the amount of the current flowing through the active region of the diode can be ensured, an increase in the current density can be suppressed in the boundary region between the edge termination region and the diode active region, and also, thermal destruction resulting from increased temperature in this boundary region can be suppressed. In other words, the breakdown voltage in the boundary region is increased.

In addition to the above-described effects, the semiconductor device according to another aspect and still another aspect of the present invention allows a reduction in a forward voltage drop ($V_F$) and suppression of the oscillation during recovery.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the accompanying drawings.

First Embodiment

Figure 1:
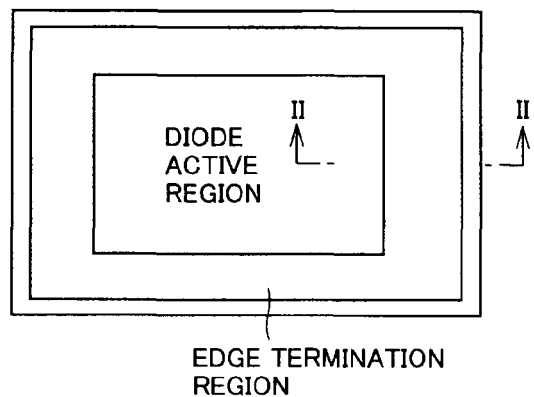
FIG. 1 is a schematic diagram of a semiconductor device in plan view according to the first embodiment.

Referring to FIG. 1, the semiconductor device (diode) according to the present embodiment includes a diode active region and an edge termination region. The edge termination region surrounds the diode active region as seen in plan view.

Figure 2:
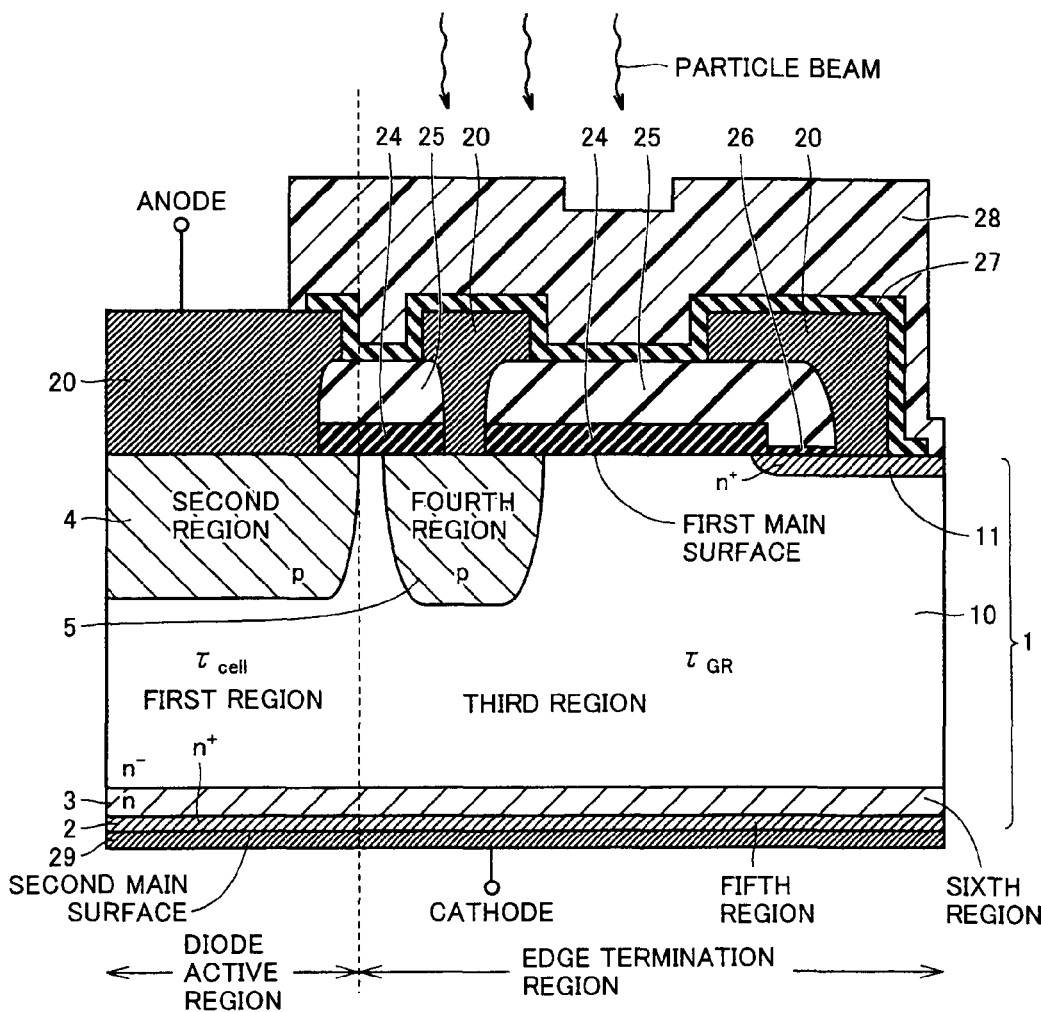
FIG. 2 is a schematic cross-sectional view of the semiconductor device according to Example 1 in the first embodiment.

FIG. 2 is a cross-sectional view taken along a line II-II in FIG. 1. Referring to FIG. 2, the semiconductor device according to Example 1 in the present embodiment includes a semiconductor substrate 1. Semiconductor substrate 1 is, for example, made of a single crystal of silicon, has the first main surface and the second main surface facing each other, and has the diode active region and the edge termination region as described above.

In the diode active region, a region (first region) of an n-type (first conductivity type) and a region (second region) of a p-type (second conductivity type) are joined to form a pn junction diode. Specifically, it includes an n⁻ drift layer 10 (drift region), an n⁺ layer 2 (fifth region) and an n-type layer 3 (sixth region) as an n-type region. Furthermore, n⁻ drift layer 10 is formed within semiconductor substrate 1 and corresponds to a main area of semiconductor substrate 1; n⁺ layer 2 is formed to extend from the second main surface (the main surface on the underside) to a predetermined depth in semiconductor substrate 1; and n-type layer 3 is formed so as to be located on n⁺ layer 2, more specifically, between n⁻ drift layer 10 and n⁺ layer 2.

Formation of n⁺ layer 2 causes a decrease in the value of the contact resistance with a cathode electrode 29. Furthermore, n-type layer 3 is formed between n⁻ drift layer 10 and n⁺ layer 2, which allows n-type layer 3 to function as a buffer layer between n⁻ drift layer 10 and n⁺ layer 2.

Furthermore, semiconductor substrate 1 has a p-type region 4 as a region of a p-type (second region). P-type region 4 is formed to extend from the first main surface (the main surface on the upper side) to a depth, for example, of 1.0 to 10.0 μm in semiconductor substrate 1.

The peak value of the impurity concentration of n-type layer 3 is higher than the peak value of the impurity concentration of n⁻ drift layer 10. Furthermore, the peak value of the impurity concentration of n⁺ layer 2 is higher than the peak value of the impurity concentration of n-type layer 3.

For example, n⁻ drift layer 10 has a concentration of $1 \times 10^{12}$ to $1 \times 10^{15}$ cm⁻³, and n-type layer 3 has a peak concentration of $1 \times 10^{16}$ to $1 \times 10^{17}$ cm⁻³. It is to be noted that the peak concentration means the highest concentration in the relevant region. Furthermore, n⁺ layer 2 has a surface concentration (impurity concentration in the interface between n⁺ layer 2 and cathode electrode 29) of $1 \times 10^{18}$ to $1 \times 10^{20}$ cm⁻³, and p-type region 4 has a surface concentration of p-type impurities of $1 \times 10^{16}$ to $1 \times 10^{18}$ cm⁻³. Also, n-type layer 3 has a depth of 20.0 to 30.0 μm and n⁺ layer 2 has a depth of 0.5 to 5.0 μm.

Each region constituting semiconductor substrate 1 has the above-described impurity concentration, which allows the diode active region to function as a pn junction diode.

In the edge termination region, an n-type region (the third region) and a p-type region (the fourth region) are formed. Specifically, the edge termination region includes n⁻ drift layer 10, n⁻ layer 2, n-type layer 3, and an n⁻ region 11 as an n-type region. The arrangement thereof is the same as that in the diode active region. Furthermore, it also includes a p-type region 5 as a region of a p-type (the fourth region). This p-type region 5 is a region serving as a guard ring as an edge termination.

The edge termination region corresponds to a region disposed in order to suppress a decrease in the breakdown voltage of the semiconductor device. Specifically, when the diode active region is brought into an OFF state, a depletion layer extending in the lateral direction in FIG. 1 is formed within n⁻ drift layer 10 in the edge termination region, thereby increasing the breakdown voltage of the semiconductor device.

In order to achieve the function of the edge termination region as described above, it is preferable that the p-type impurity concentration in p-type region 5 of the edge termination region is, for example, $1 \times 10^{16}$ to $1 \times 10^{18}$ cm$^{-3}$. However, it is preferable that n⁻ drift layer 10, n⁺ layer 2 and n-type layer 3 in the edge termination region are identical in impurity concentration distribution to n⁻ drift layer 10, n⁺ layer 2 and n-type layer 3, respectively, in the diode active region. In other words, for example, n⁻ drift layer 10 is shared by each n-type region of the diode active region and the edge termination region. Similarly, n⁺ layer 2 and n-type layer 3 are also shared by each n-type region of the diode active region and the edge termination region.

In the semiconductor device in FIG. 2, a carrier lifetime $\tau_{GR}$ in n⁻ drift layer 10 of the edge termination region is shorter than a carrier lifetime $\tau_{cell}$ in n⁻ drift layer 10 of the diode active region. The carrier lifetime of n⁻ drift layer 10 referred herein corresponds to a time period from when carriers (electrons and holes) flow into n⁻ drift layer 10 until when the carriers disappear.

Specifically, the number of crystal defects per unit volume in the crystals forming n⁻ drift layer 10 in the edge termination region is greater than the number of crystal defects per unit volume in the crystals forming n⁻ drift layer 10 in the diode active region. In order to achieve this configuration, a particle beam is applied only to n⁻ drift layer 10 in the edge termination region.

For example, an electron beam, a proton, helium, and the like may be used for this particle beam. In this case, for example, a mask coated with stainless steel and the like is used to cause the particle beam to be applied not to the diode active region but only to the edge termination region.

Consequently, crystal defects occur only in n⁻ drift layer 10 of the edge termination region. These crystal defects result in the recombination center of electrons and holes flowing into n⁻ drift layer 10 in the edge termination region. Therefore, carrier lifetime $\tau_{GR}$ in n⁻ drift layer 10 of the edge termination region is shorter than carrier lifetime $\tau_{cell}$ in n⁻ drift layer 10 of the diode active region.

It is preferable that the average value of carrier lifetime $\tau_{GR}$ in n⁻ drift layer 10 of the edge termination region is less than or equal to 1.0 μsec. In this case, it is preferable that the average value of carrier lifetime $\tau_{cell}$ in n⁻ drift layer 10 of the diode active region is greater than 1.0 μsec.

An anode electrode 20 is formed on the first main surface of semiconductor substrate 1. Anode electrode 20 is made, for example, of aluminum-based metal material, and formed on p-type regions 4 and 5 each as an anode. Oxide films 24, 25 and 26 are formed in the region sandwiched between adjacent anode electrodes 20. It is preferable that oxide film 24 is, for example, a silicon oxide film while oxide film 25 is, for example, an oxide film having silicate glass doped with impurities. Although oxide film 26 is made of the same material as that of oxide film 24, it is preferable that oxide film 26 is less in thickness than oxide film 24. Furthermore, passivation films 27 and 28 are formed so as to cover anode electrode 20 and oxide film 25. It is preferable that passivation film 27 is made of a silicon oxide film or a silicon nitride film while passivation film 28 is, for example, a polyimide resin based film.

A cathode electrode 29 is formed on the second main surface of semiconductor substrate 1 (on n⁺ layer 2 as a cathode). Cathode electrode 29 which is, for example, made of aluminum-based metal material may have a multilayer structure made of a gold thin film and an aluminum thin film, for example.

Then, the functions and effects of the present semiconductor device will be described.

Figure 3:
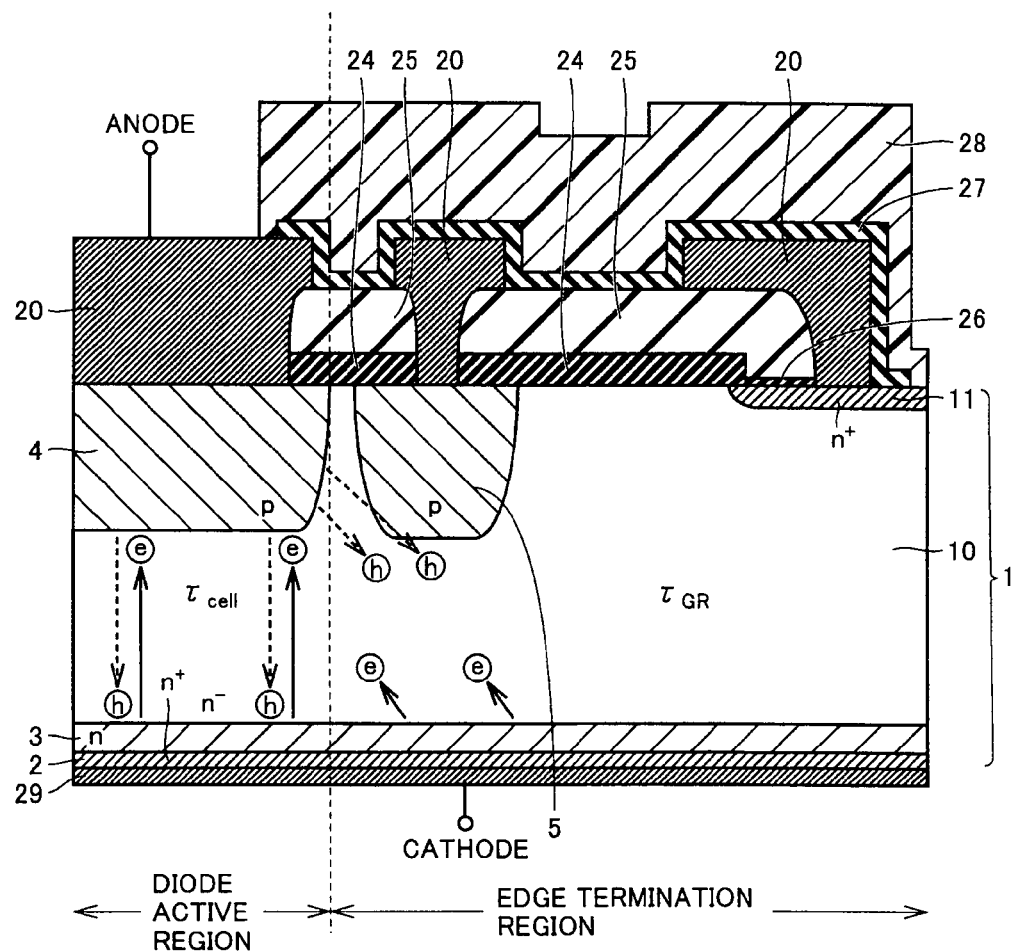
FIG. 3 is a schematic cross-sectional view of movement of carriers when a voltage in the forward direction is applied to the semiconductor device in FIG. 2.

Referring to FIG. 3, in the ON state where a high voltage is applied in the forward direction between anode electrode 20 and cathode electrode 29 of the present semiconductor device, a plurality of carriers are accumulated in n⁻ drift layer 10 of the diode active region. In other words, holes are injected from p-type region 4 into n⁻ drift layer 10, while electrons are injected from n-type layer 3 into n⁻ drift layer 10. Holes injected from p-type region 4 into n⁻ drift layer 10 partially flow toward n⁻ drift layer 10 in the edge termination region. Electrons injected from n-type layer 3 into n⁻ drift layer 10 in the edge termination region partially flow toward n⁻ drift layer 10 in the diode active region. Consequently, a current flows through the diode active region in the state where a voltage is applied in the forward direction.

In this case, the edge termination region has n⁻ drift layer 10 that is greater in number of crystal defects and shorter in carrier lifetime than n⁻ drift layer 10 of the diode active region. Accordingly, electrons and holes flowing into n⁻ drift layer 10 in the edge termination region are recombined with each other and disappear immediately as compared with the electrons and holes flowing into n⁻ drift layer 10 in the diode active region.

Figure 4:
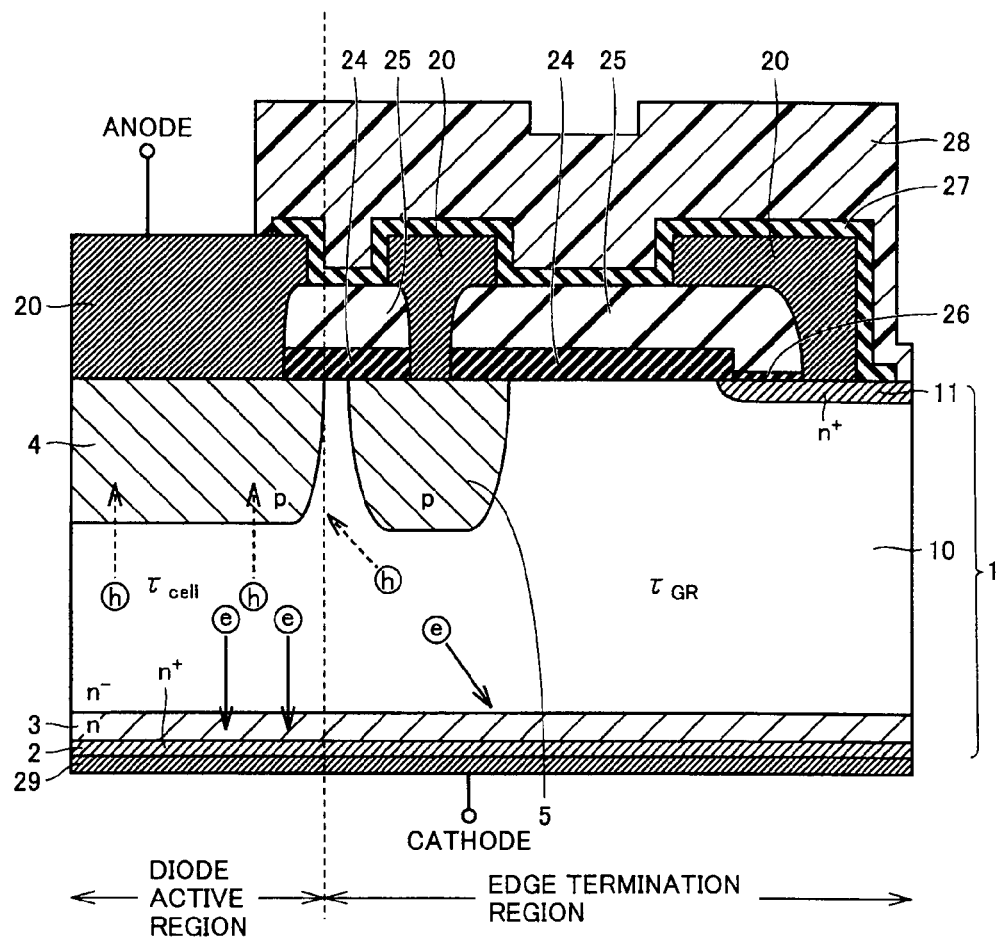
FIG. 4 is a schematic cross-sectional view of movement of carriers when a voltage in the reverse direction is applied to the semiconductor device in FIG. 2.

Referring to FIG. 4, when a high voltage is applied in the reverse direction between anode electrode 20 and cathode electrode 29 of the present semiconductor device, the diode is brought from the above-described ON state into an OFF state. Then, electrons and holes in the carriers accumulated in n⁻ drift layer 10 are discharged from cathode electrode 29 and anode electrode 20, respectively.

However, most of the carriers disappear that flow into n⁻ drift layer 10 in the edge termination region in the ON state. Accordingly, when switching into the OFF state, the amount of carriers flowing from n⁻ drift layer 10 in the edge termination region into cathode electrode 29 and anode electrode 20 in the diode active region is decreased. This will be described referring, as a comparative example, to the normal semiconductor device in which the carrier lifetime of n⁻ drift layer 10 in the edge termination region is not shortened.

Figure 5:
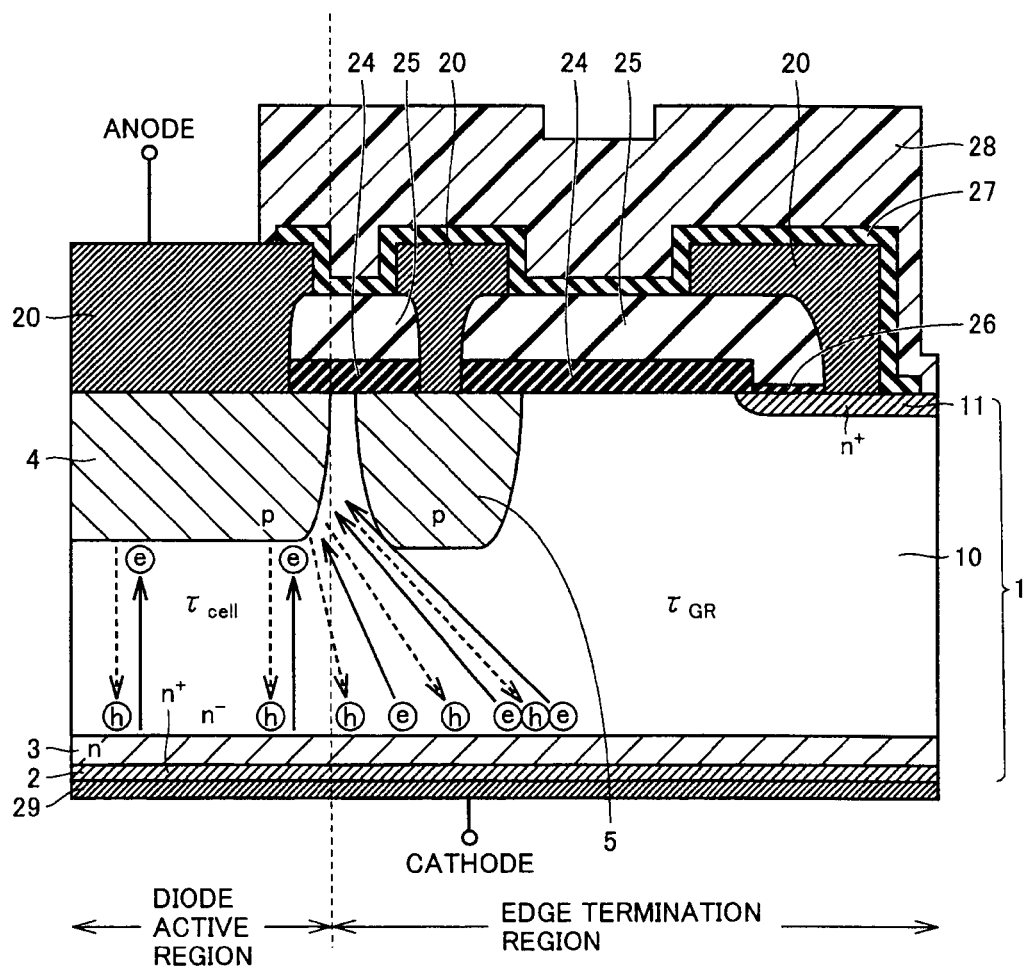
FIG. 5 is a schematic cross-sectional view of movement of carriers when a voltage in the forward direction is applied to the semiconductor device as a comparative example in FIG. 2.
Figure 6:
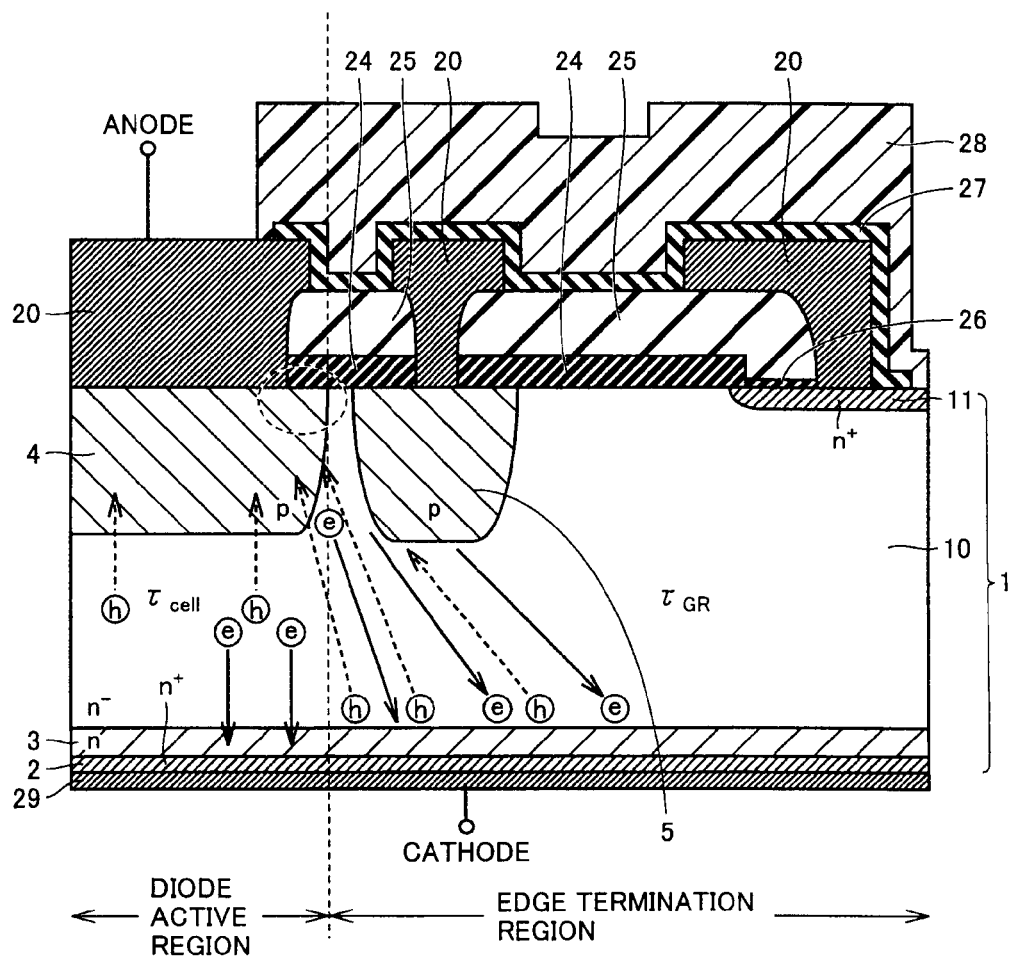
FIG. 6 is a schematic cross-sectional view of movement of carriers when a voltage in the reverse direction is applied to the semiconductor device as the comparative example in FIG. 2.

The semiconductor device in each of FIGS. 5 and 6 is different from the semiconductor device in each of FIGS. 2 to 4 only in that the carrier lifetime in n⁻ drift layer 10 in the edge termination region is not shortened. Other configurations are the same as those in the semiconductor device in each of FIGS. 2 to 4.

Referring to FIG. 5, in the ON state where a high voltage is applied in the forward direction between anode electrode 20 and cathode electrode 29 of the present semiconductor device, a plurality of carriers are accumulated in n⁻ drift layer 10 of the diode active region. The carriers flowing into n⁻ drift layer 10 in the edge termination region of the semiconductor device in FIG. 5 are more likely to be accumulated as compared with the electrons and holes flowing into n⁻ drift layer 10 in the edge termination region of the semiconductor device in each of FIGS. 2 to 4.

Referring to FIG. 6, when switching from the above-described ON state into an OFF state, the plurality of carriers accumulated in n⁻ drift layer 10 in the edge termination region flow toward the diode active region. This flow of the carriers causes an increase in the current density in the boundary region between the diode active region and the edge termination region, which leads to concentration of a current particularly in the area surrounded by a dotted circle (the outer peripheral end of the anode) in FIG. 6. Consequently, thermal destruction resulting from increased temperature may occur in this region.

However, in the semiconductor device of the present embodiment, as shown in FIG. 4, the amount of carriers is relatively small that are accumulated in n⁻ drift layer 10 in the edge termination region when the recovery operation for switching from the ON state into the OFF state is performed. Accordingly, the amount of carriers flowing from the edge termination region into the diode active region is relatively small. This allows suppression of an increase in the current density and suppression of thermal destruction resulting from increased temperature in the boundary region between the edge termination region and the diode active region. Consequently, the safe operating area (SOA) where the diode operates safely can be expanded at the time of recovery of the diode active region.

On the other hand, in the diode active region, a normal amount of current can be applied without suppression of an increase in the current density. This is because the process for shortening the carrier lifetime is not carried out in n⁻ drift layer 10 in the diode active region. In other words, the carriers flowing from n-type layer 3 and p-type region 4 into n⁻ drift layer 10 in the ON state function to cause a normal rectification action by the voltage applied to the diode active region.

As described above, the semiconductor device allows the amount of the current flowing through the active region of the diode to be maintained, and also allows suppression of an increase in the current density in the boundary region between the edge termination region and the diode active region, thereby preventing thermal destruction resulting from increased temperature in this boundary region. In other words, the breakdown voltage during the recovery operation of the diode is increased.

Then, the semiconductor device according to Example 2 in the present embodiment which is different from the semiconductor device in each of FIGS. 2 to 4 will be hereinafter described.

Figure 7:
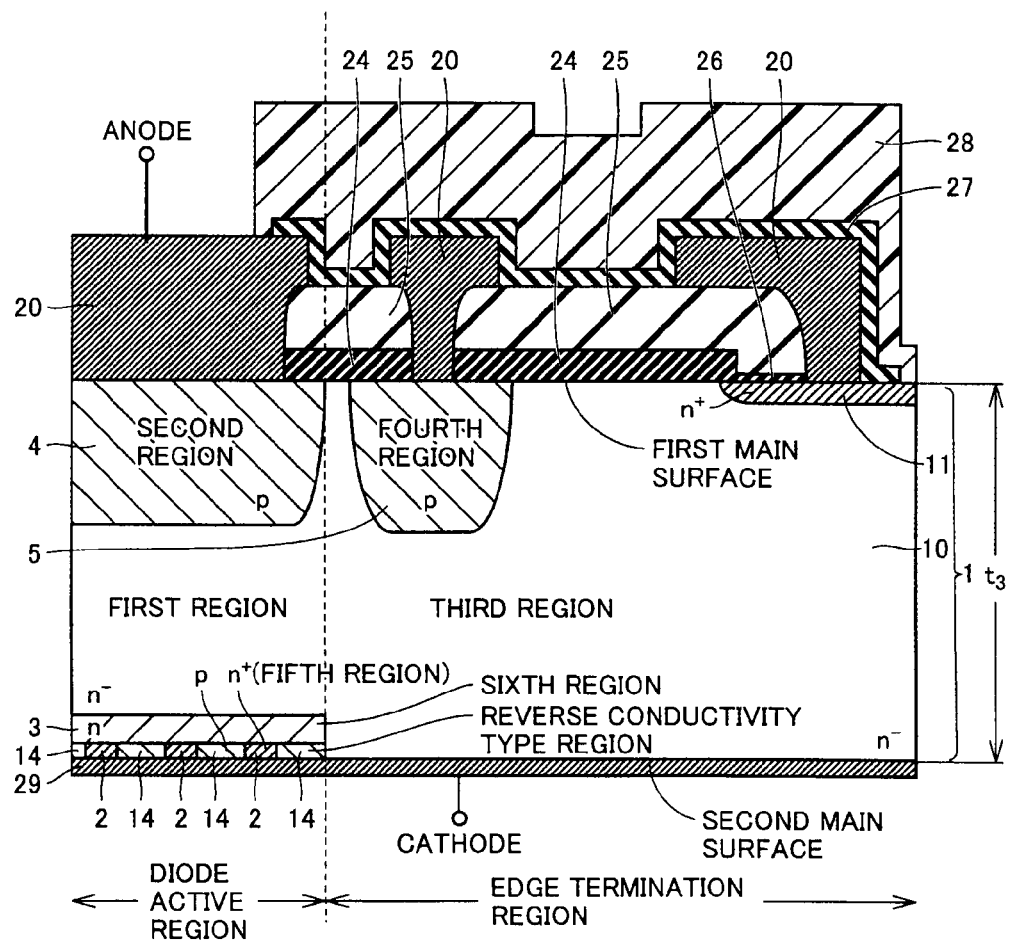
FIG. 7 is a schematic cross-sectional view of the semiconductor device according to Example 2 in the first embodiment.

Referring to FIG. 7, the semiconductor device according to Example 2 in the present embodiment is different in the cathode configuration from the semiconductor device in Example 1. Specifically, n⁺ layer 2 (the fifth region) and n-type layer 3 (the sixth region) are formed only in the diode active region. Furthermore, n⁺ layer 2 and a p-type region 14 (the reverse conductivity type region of a second conductivity type) which is a region of a p-type are alternately arranged adjacent to each other in plan view. The second main surface of the edge termination region is formed by n⁻ drift layer 10.

The surface concentration of n-type layer 3 is $1 \times 10^{16}$ to $1 \times 10^{17}$ cm⁻³. Furthermore, the surface concentration of n⁺ layer 2 is $1 \times 10^{19}$ to $1 \times 10^{20}$ cm⁻³. The p-type impurity concentration in p-type region 14 is $1 \times 10^{17}$ to $1 \times 10^{19}$ cm⁻³ The depth of n-type layer 3 is 1.5 to 3.0 μm while the depth of each of n⁺ layer 2 and p-type region 14 is 0.2 to 1.0 μm. The impurity concentration in each of other regions is the same as those of the semiconductor device in FIG. 2.

The semiconductor device in FIG. 7 is not subjected to the process for shortening the carrier lifetime of n⁻ drift layer 10 in the edge termination region as in the semiconductor device in each of FIGS. 2 to 4. However, the above-described process may be performed also in the semiconductor device in FIG. 7.

The configuration in Example 2 is the same as that in Example 1 except for the above-described configuration. Therefore, the components in FIG. 7 identical to those in Example 1 are designated by the same reference characters, and description thereof will not be repeated.

Then, the functions and effects of the present semiconductor device will be described as compared with those in FIGS. 5 and 6 as described above.

Figure 8:
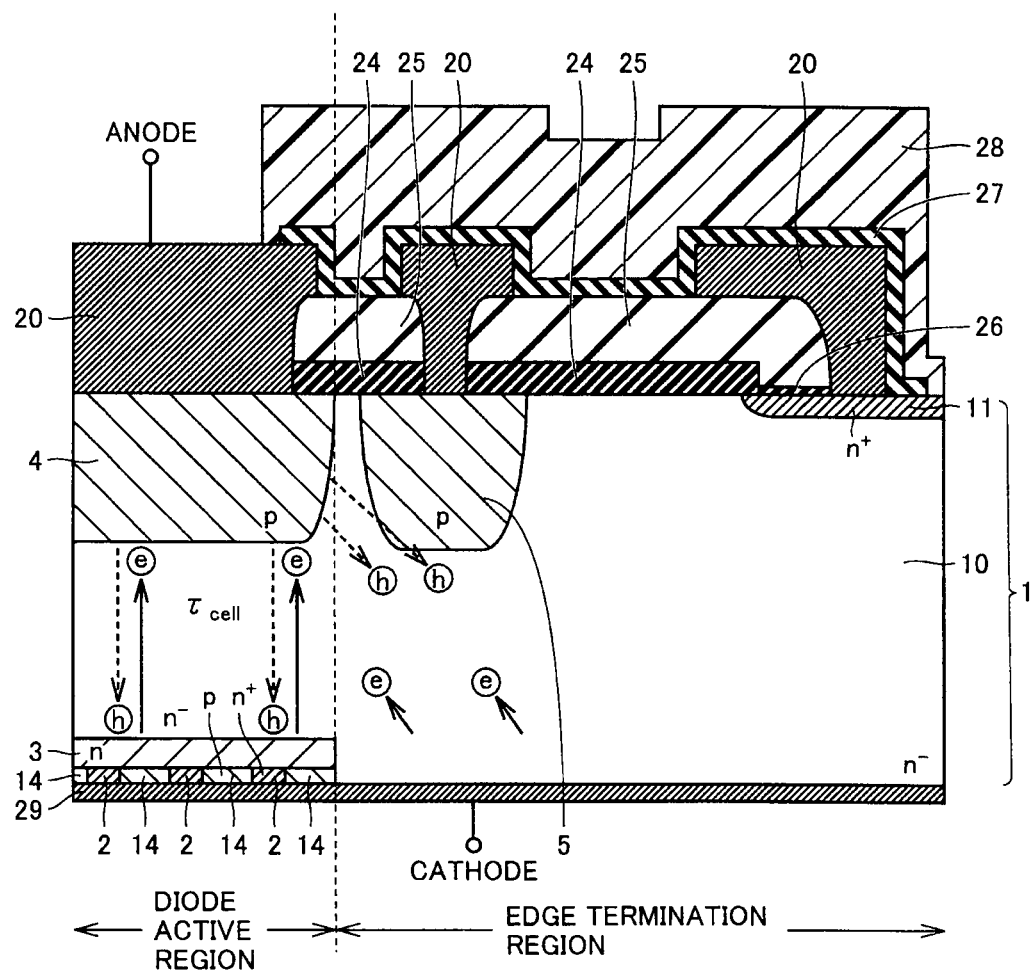
FIG. 8 is a schematic cross-sectional view of movement of carriers when a voltage in the forward direction is applied to the semiconductor device in FIG. 7.

Referring to FIG. 8, in the ON state where a high voltage is applied in the forward direction between anode electrode 20 and cathode electrode 29 of the present semiconductor device, a plurality of carriers are accumulated in n⁻ drift layer 10 in the diode active region. In other words, holes are injected from p-type region 4 into n⁻ drift layer 10, while electrons are injected from n-type layer 3 into n⁻ drift layer 10. The holes injected from p-type region 4 into n⁻ drift layer 10 partially flow toward n⁻ drift layer 10 in the edge termination region. Also, the electrons injected from n-type layer 3 into n⁻ drift layer 10 in the edge termination region partially flow toward n⁻ drift layer 10 in the diode active region. Accordingly, a current flows through the diode active region in the state where a voltage is applied in the forward direction.

In this case, on the second main surface side of the edge termination region, for example, n⁻ drift layer 10 having a relatively low impurity concentration as compared with those of n-type layer 3 and n⁺ layer 2 is connected to cathode electrode 29. This causes a reduction in the amount of the electrons moving from the cathode electrode 29 side toward the anode electrode 20 side in n⁻ drift layer 10, for example, as compared with the case in FIG. 5 in which n-type layer 3 and the like are arranged on the second main surface side of the edge termination region. This also results in a reduction in the amount of the electrons flowing from the cathode electrode 29 side in the edge termination region toward the anode electrode 20 side in the diode active region.

Figure 9:
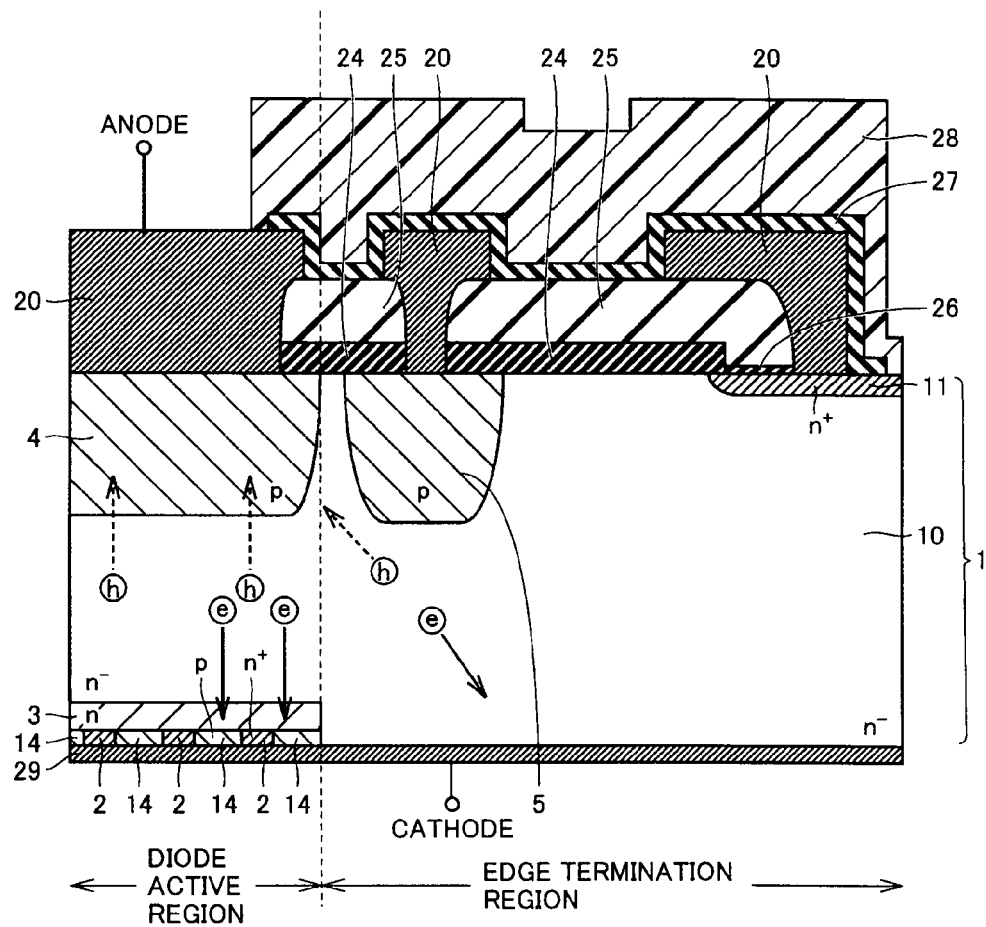
FIG. 9 is a schematic cross-sectional view of movement of carriers when a voltage in the reverse direction is applied to the semiconductor device in FIG. 7.
Figure 10:
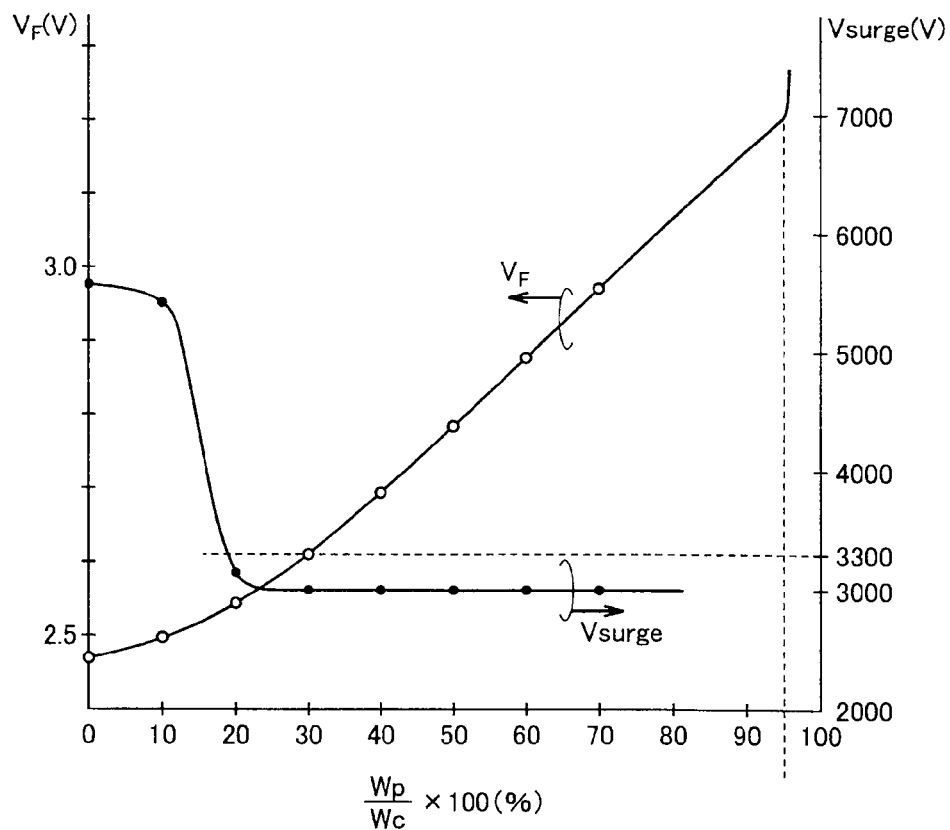
FIG. 10 is a graph showing an example of the relationship between each of $V_F$ and a surge voltage $V_{surge}$ in the rated current density, and a ratio of a width $W_p$ of a p-type region to a width $W_c$ of an $n^+$ layer and a p-type region, according to the semiconductor device in FIG. 7.
Figure 11:
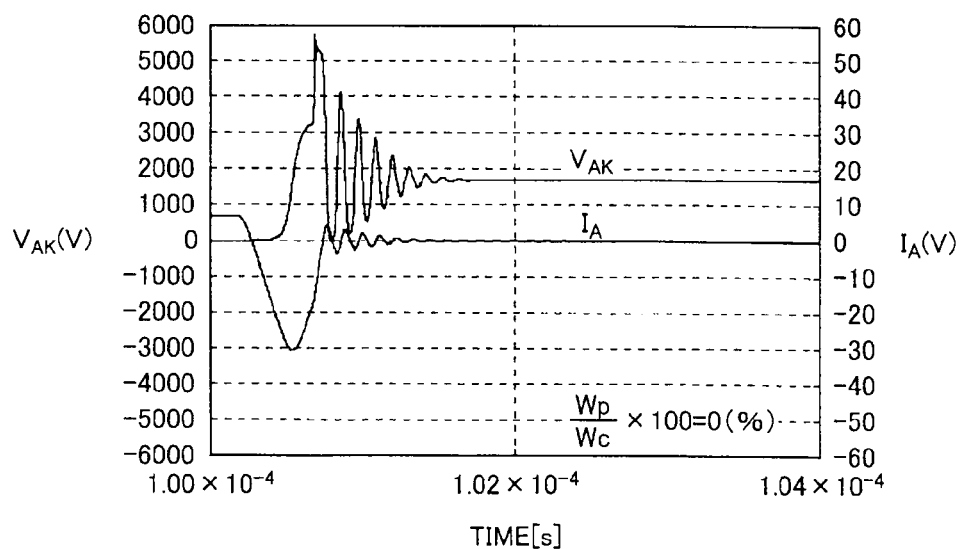
FIG. 11 is a graph showing an example of the recovery characteristics of the diode when the ratio of width $W_p$ of the p-type region to width $W_c$ of the $n^+$ layer and the p-type region in FIG. 7 is equal to 0%.
Figure 12:
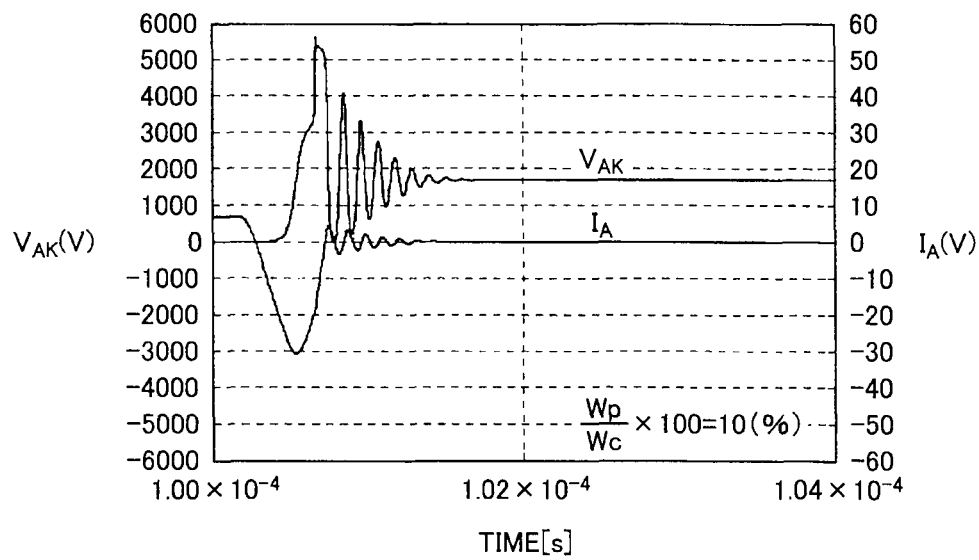
FIG. 12 is a graph showing an example of the recovery characteristics of the diode when the ratio of width $W_p$ of the p-type region to width $W_c$ of the $n^+$ layer and the p-type region in FIG. 7 is equal to 10%.
Figure 13:
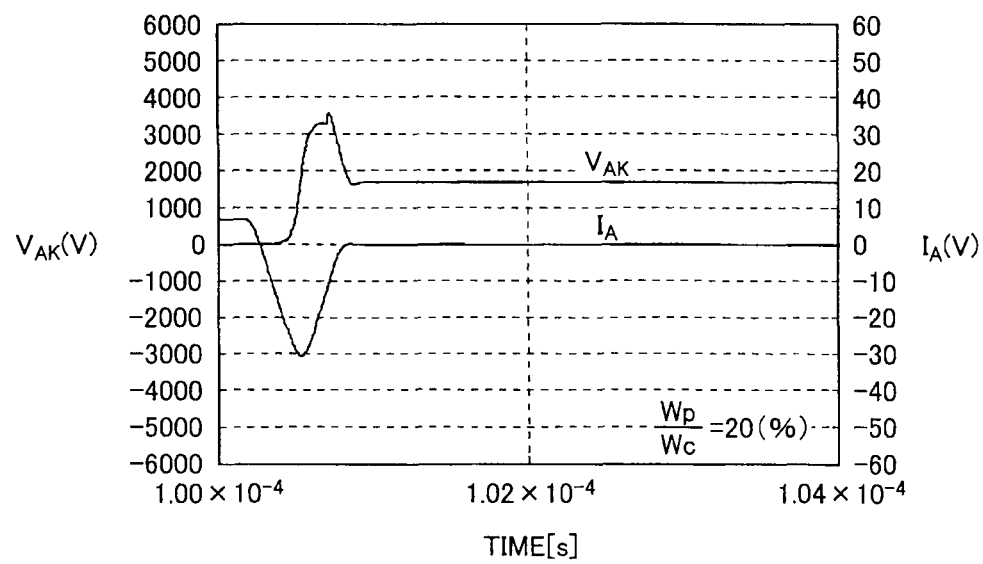
FIG. 13 is a graph showing an example of the recovery characteristics of the diode when the ratio of width $W_p$ of the p-type region to width $W_c$ of the $n^+$ layer and the p-type region in FIG. 7 is equal to 20%.
Figure 14:
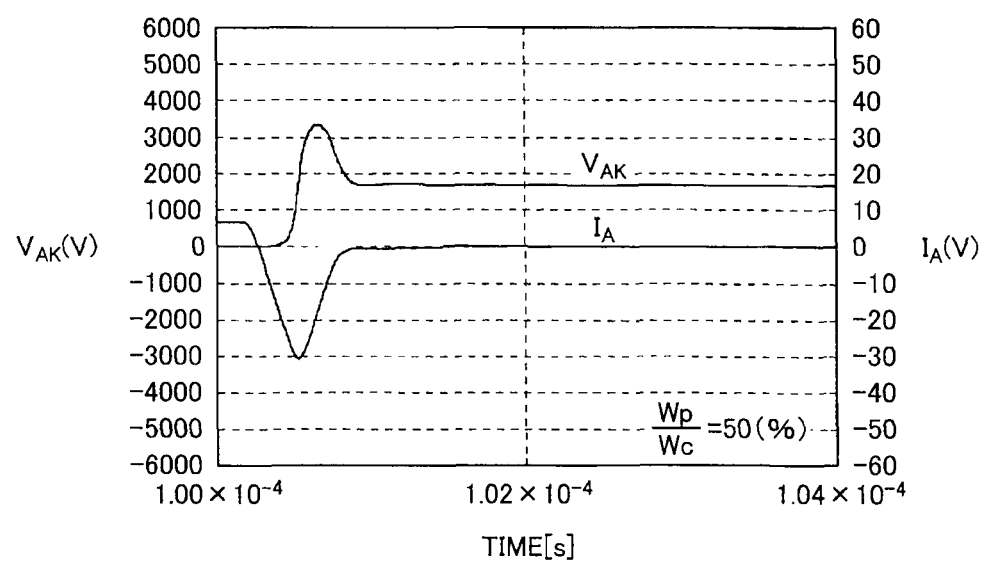
FIG. 14 is a graph showing an example of the recovery characteristics of the diode when the ratio of width $W_p$ of the p-type region to width $W_c$ of the $n^+$ layer and the p-type region in FIG. 7 is equal to 50%.

Referring to FIG. 9, when a high voltage is applied in the reverse direction between anode electrode 20 and cathode electrode 29 of the present semiconductor device, the diode is brought from the above-described ON state into an OFF state. In this case, electrons and holes in the carriers accumulated in n⁻ drift layer 10 are discharged from cathode electrode 29 and anode electrode 20, respectively.

However, as compared with FIG. 6, the amount of carriers is reduced which flow back and forth through the boundary region between the edge termination region and the diode active region. This is because the amount of electrons is relatively small that flow from the cathode electrode 29 side in the edge termination region into the anode electrode 20 side in the diode active region in the ON state.

Accordingly, as compared with the semiconductor device in each of FIGS. 5 and 6, it becomes possible to suppress an increase in the current density and also suppress thermal destruction resulting from increased temperature in the boundary region between the edge termination region and the diode active region. In other words, the breakdown voltage during the recovery operation of the diode is increased. Furthermore, the safe operating area (SOA) where the diode operates safely can be expanded at the time of recovery during which the diode active region is brought from an ON state into an OFF state.

On the other hand, p-type region 14 to which electrons are hardly injected is formed in the cathode of the diode active region. However, n⁺ layer 2 to which a plurality of electrons can be injected is formed adjacent to the p layer. Accordingly, there is little influence on the amount of the current flowing through n⁻ drift layer 10 in the diode active region both in the ON state and OFF state. Therefore, the normal function of the diode can be ensured in the diode active region.

Furthermore, n⁺ layer 2 and p-type region 14 are provided as a cathode in the diode active region of the present Example. This causes a reduction in a forward voltage drop ($V_F$), thereby suppressing the oscillation during the recovery, which will be hereinafter described in detail.

Again referring to FIG. 7, in the diode structure of the present Example, holes are injected from p-type region 14 during the recovery phenomenon, which causes an increase in the hole concentration on the cathode side, for example, as compared with the hole concentration on the cathode side in the diode structure of the comparative example in FIG. 5.

Consequently, the electric field on the cathode side is reduced in the present embodiment as compared with the comparative example, which allows suppression of extension of the depletion layer from the junction serving as a main junction between p-type region 4 and n⁻ drift layer 10 toward the cathode side. Accordingly, the oscillation phenomenon during recovery is suppressed, which allows an increase in SOA tolerance of the diode.

In this way, the diode in FIG. 7 can serve to suppress oscillation by causing a reduction in the electric field by injecting holes from p-type region 4 during the recovery phenomenon (suppressing extension of the depletion layer). Accordingly, a thickness $t_3$ of n⁻ drift layer 10 can be reduced to thereby improve the trade-off characteristics between a recovery loss $E_{REC}$ and $V_F$, which will be hereinafter described with reference to the following equations.

In general, an electrical resistance R of n⁻ drift layer 10 in the ON state is represented by the following equation.

$$R \propto t^2/(2\sqrt{(D \cdot \tau^2)}) \qquad (1)$$

In this case, t represents a thickness of the n⁻ drift layer 10 (=$t_3$), D represents a diffusion coefficient and τ represents a carrier lifetime in the n⁻ drift layer 10. In other words, when t is increased, R is increased, with the result that $V_F$ of the diode is increased. Consequently, the trade-off characteristics between $V_F$ and $E_{REC}$ are shifted toward deterioration. In other words, when t is decreased, the $V_F$-$E_{REC}$ trade-off characteristics can be improved.

In order to decrease $V_F$ and surge voltage $V_{surge}$ which is a peak value of a voltage $V_{AK}$ during recovery of the diode, a ratio of the area of p-type region 14 to the area of the diode active region (the ratio of an area $W_p$ of p-type region 14 to an area $W_p$ of the region including n⁺ layer 2 and p-type region 14) is employed as an important parameter.

Mainly referring to FIGS. 10 to 14, in order to review the correlation (FIG. 10) of each of $V_F$ and surge voltage $V_{surge}$ with a width ratio $W_p/W_c$ in each of FIGS. 7 to 9, simulations (for example, FIGS. 11 to 14) were performed for the waveform of the recovery characteristics under various ratios $W_p/W_c$ (change over time of each of a current $I_A$ and voltage $V_{AK}$ during recovery).

Consequently, in the case where width $W_p$ is 20% or more of width $W_c$, that is, where the ratio of the area of p-type region 14 to the total area of n⁺ layer 2 and p-type region 14 (FIGS. 7 to 9) is 20% or more, the oscillation during recovery is suppressed, to thereby remarkably lowering surge voltage $V_{surge}$ to 3300 V or lower which corresponds to a rated voltage.

Furthermore, when width $W_p$ exceeds 95% of width $W_c$, $V_F$ is rapidly increased, which may hamper the operation of the diode. Conversely, when width $W_p$ is set at 95% or lower of width $W_c$, that is, the ratio of the area of p-type region 14 to the total area of n⁺ layer 2 and p-type region 14 is set at 95% or lower, $V_F$ is remarkably suppressed.

As described above, when the following equation (2) is satisfied, the excellent operation of the diode can be ensured while suppressing the oscillation at the time of recovery.

$$20\% \leq W_p/W_c \leq 95\% \qquad (2)$$

Thus, when the equation (2) is satisfied and thickness $t_3$ is decreased, $V_F$ is decreased while the oscillation during recovery is suppressed.

Accordingly, in addition to the effects of the semiconductor device in Example 1, the semiconductor device in Example 2 has effects that $V_F$ can be decreased and the oscillation at the time of recovery can be suppressed.

Then, the semiconductor device according to Example 3 in the present embodiment that is different from the semiconductor device in each of FIGS. 7 to 9 will be described.

Figure 15:
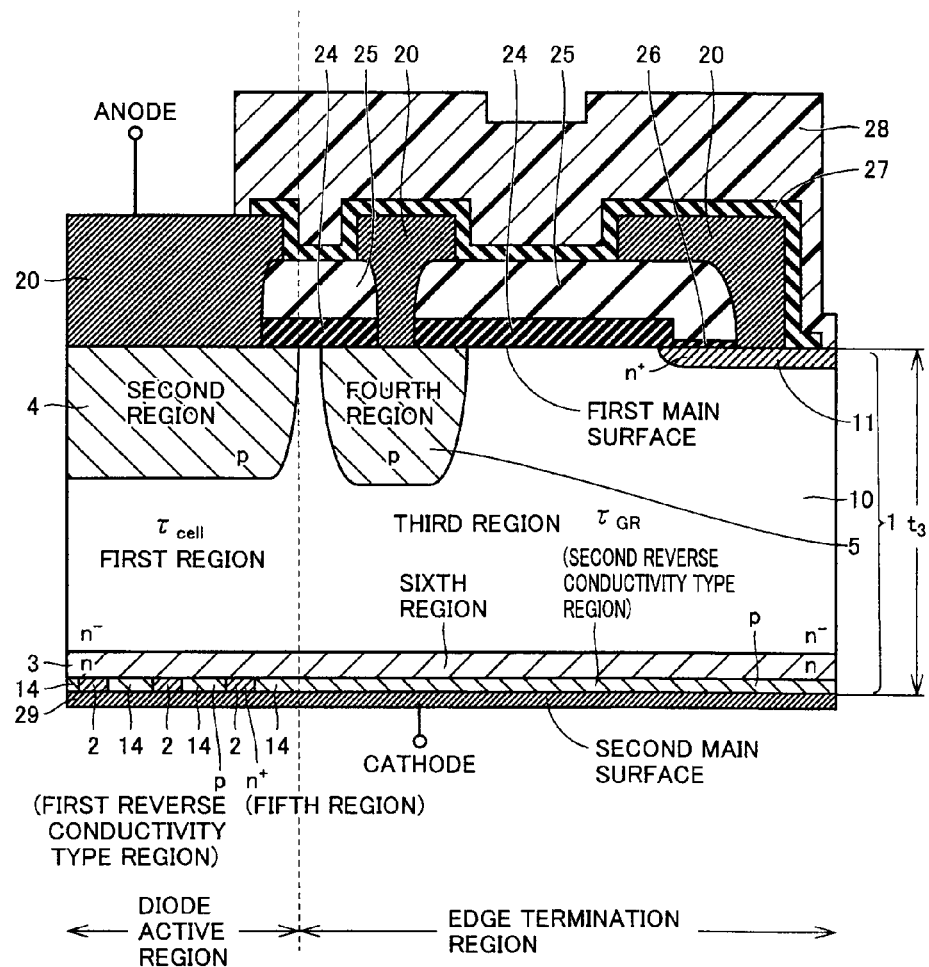
FIG. 15 is a schematic cross-sectional view of the semiconductor device according to Example 3 in the first embodiment.

Referring to FIG. 15, the semiconductor device according to Example 3 in the present embodiment is different in the cathode configuration from the semiconductor device in Example 2. Specifically, p-type layer 14 which is a region of a p-type (the second reverse conductivity type region of a second conductivity type) and n-type layer 3 which is a region of an n-type are provided in the edge termination region. In other words, p-type region 14 (the first reverse conductivity type region of the second conductivity type) and n-type layer 3 in the diode active region is configured to extend to the edge termination region.

The impurity concentration and the depth in each of p-type layer 14 and n-type layer 3 in the edge termination region are the same as the impurity concentration and the depth in each of p-type region 14 and n-type layer 3 in the semiconductor device in FIG. 7.

Since Example 3 is almost identical in configuration to Example 2 except for the above-described configuration. Therefore, the components in FIG. 15 identical to those in Example 2 are designated by the same reference characters, and description thereof will not be repeated.

Then, the functions and effects of the present semiconductor device will be described as compared with those in each of FIGS. 5 and 6 described above.

Figure 16:
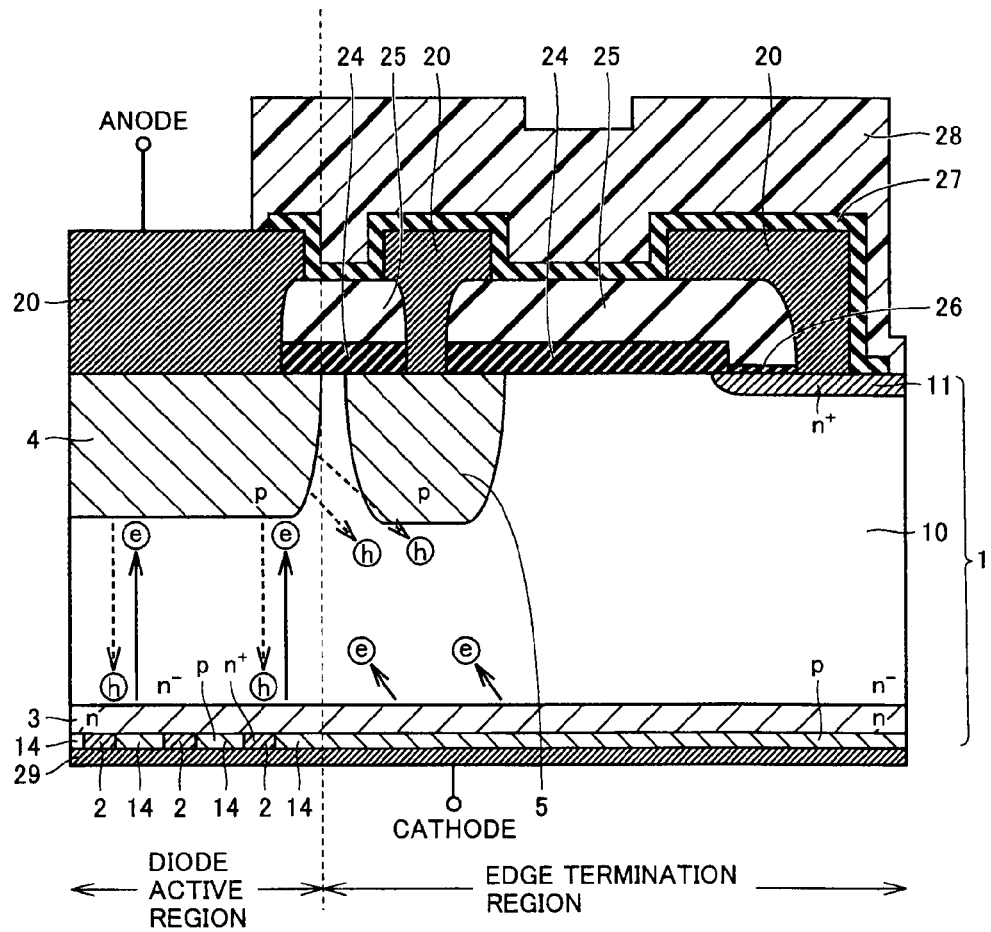
FIG. 16 is a schematic cross-sectional view of movement of carriers when a voltage in the forward direction is applied to the semiconductor device in FIG. 15.

Referring to FIG. 16, in the ON state where a high voltage is applied in the forward direction between anode electrode 20 and cathode electrode 29 of the present semiconductor device, a current flows through the diode active region as in the semiconductor device in each of Examples 1 and 2 as described above.

In this case, on the second main surface side of the edge termination region, for example, p-type layer 14 having a relatively low electron concentration as compared with that of n-type layer 3 or n⁺ layer 2 is connected to cathode electrode 29. P-type layer 14 in the edge termination region is formed for preventing the electrons from flowing from cathode electrode 29 into n⁻ drift layer 10 in the ON state of the present semiconductor device. Accordingly, the amount of the electrons is decreased that flow from the cathode electrode 29 side in the edge termination region to the anode electrode 20 side in the diode active region.

Figure 17:
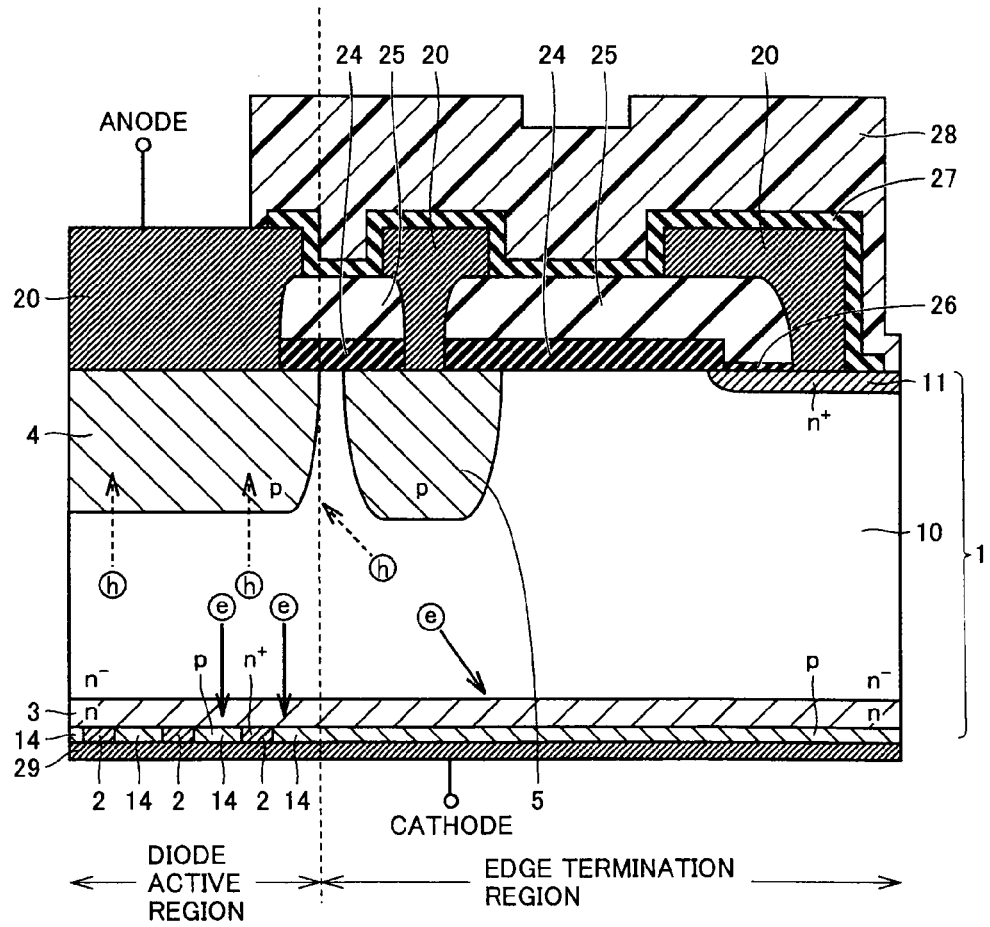
FIG. 17 is a schematic cross-sectional view of movement of carriers when a voltage in the reverse direction is applied to the semiconductor device in FIG. 15.

Referring to FIG. 17, when a high voltage is applied in the reverse direction between anode electrode 20 and cathode electrode 29 of the present semiconductor device, the diode is brought from the above-described ON state into an OFF state. In this case, electrons and holes in the carriers accumulated in n⁻ drift layer 10 are discharged from cathode electrode 29 and anode electrode 20, respectively. However, as in FIG. 9, the amount of carriers is reduced which flow back and forth through the boundary region between the edge termination region and the diode active region.

Thus, the semiconductor device according to the present Example also allows suppression of an increase in the current density and suppression of thermal destruction resulting from increased temperature in the boundary region between the edge termination region and the diode active region. Furthermore, the safe operating area (SOA) where the diode operates safely can be expanded at the time of recovery during which the diode active region is brought from an ON state into an OFF state.

In addition, the configuration of the cathode in the diode active region of the semiconductor device in the present Example is the same as that of the semiconductor device in Example 2. Therefore, the normal function of the diode can be ensured in the diode active region.

Furthermore, $n^+$ layer 2 and p-type region 14 are provided as a cathode in the diode active region in the present Example. This causes a reduction in a forward voltage drop ($V_F$), thereby suppressing the oscillation during the recovery as in the semiconductor device according to Example 2.

As described above, the semiconductor device in Example 3 has the effects similar to those of the semiconductor device in Example 2.

Further, in the present Example, n-type layer 3 is formed in the edge termination region. Accordingly, the depletion layer can be prevented from extending from the anode side towards the cathode side and reaching to p-type layer 14 during recovery in FIG. 17. Therefore, it becomes possible to suppress a reduction in the breakdown voltage of the semiconductor device by the depletion layer reaching to p-type layer 14

Then, the simulation results demonstrating the operation of the semiconductor device in each Example as described above will be explained.

Figure 18:
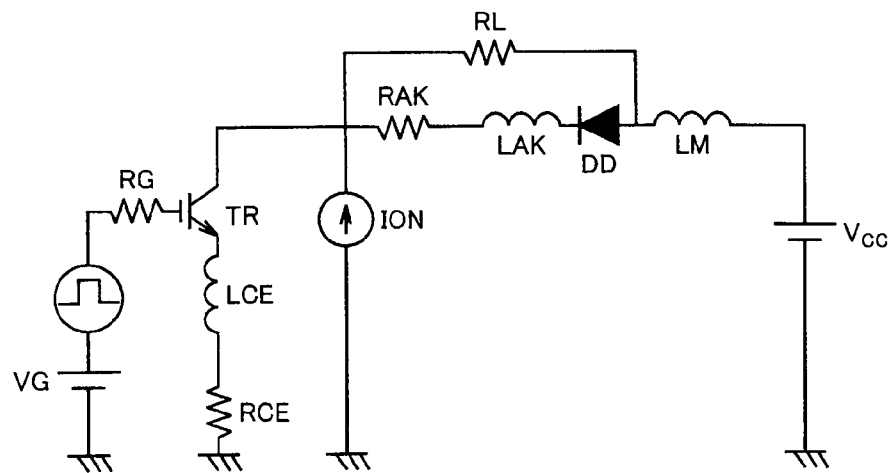
FIG. 18 is a diagram showing a circuit used for the simulation for measuring the recovery characteristics.

Referring to FIG. 18, the simulation was performed for the circuit including a diode rated at 3300V class that has been conventionally used, for example, as shown in FIGS. 5 and 6. This circuit includes a diode DD, a transistor TR which is an IGBT (Insulated Gate Bipolar Transistor), coils LM, LAK and LCE, resistances RL, RAK, RCE, and RG, power supplies Vcc and VG, and a current source ION. Coil LM corresponds to a parasitic inductance, resistance RG corresponds to a gate resistance of the IGBT, and power supply VG corresponds to a gate voltage of the IGBT. Furthermore, coils LAK and LCE each correspond to a wiring impedance for matching between the measurement results and the simulation results. Furthermore, resistances RL, RAK and RCE each correspond to a wiring-related resistance for matching between the measurement results and the simulation results. The simulation results will be hereinafter described.

Figure 19:
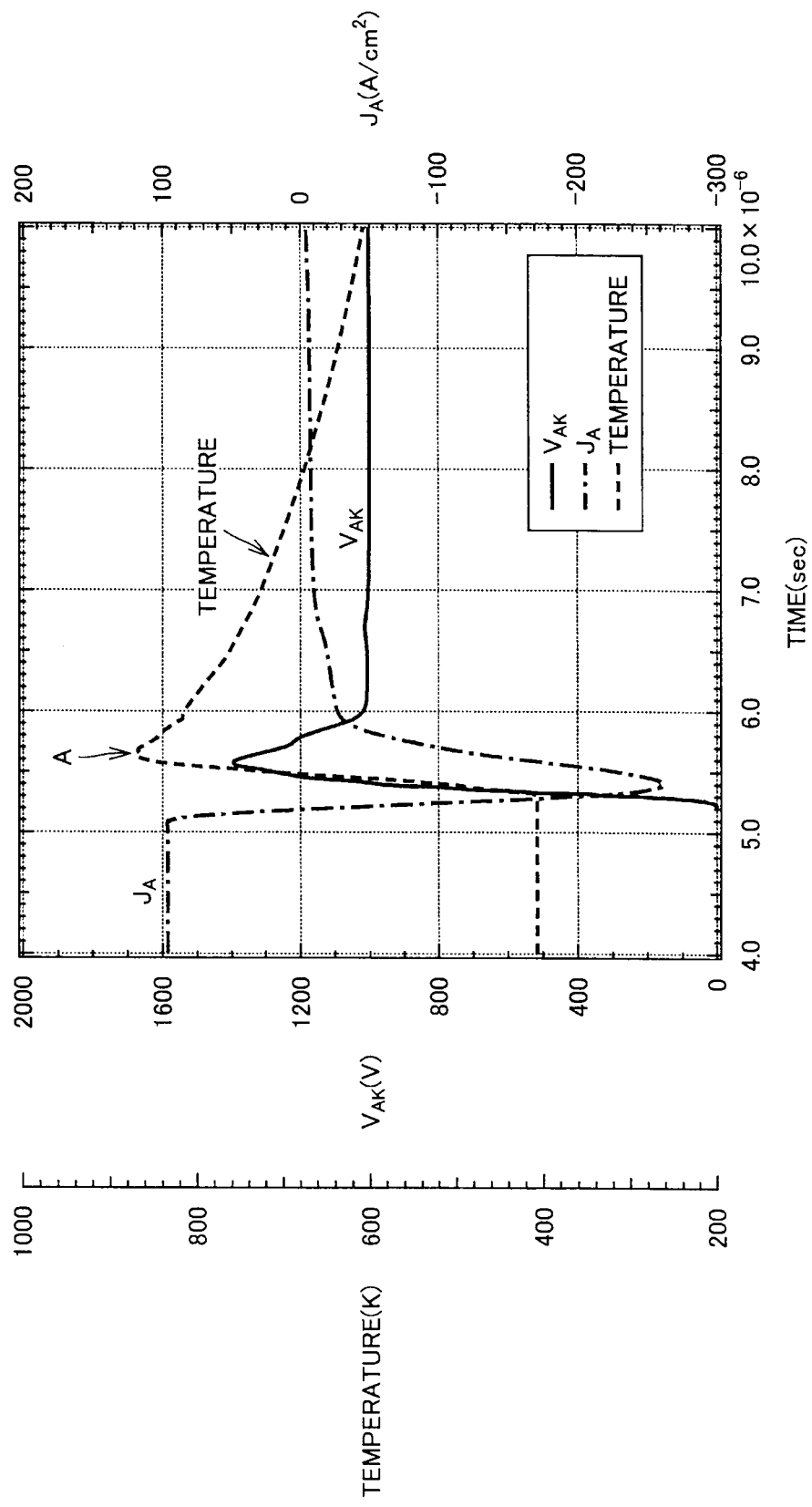
FIG. 19 is a graph showing an example of the simulation of the waveform of the recovery characteristics in the diode of the conventional example in FIG. 18.

Referring to FIG. 19, the simulation was performed with regard the waveform of the recovery characteristics in the circuit including the conventionally used diode, that is, the change over time of voltage $V_{AK}$ and a current density $J_A$ during recovery. The figure also shows a voltage $V_{AK}1$ and a current density $J_A1$ of diode DD (see FIG. 18).

It is to be noted that the width of the diode active region (for example, the width in the horizontal direction in FIG. 2) and the width of the edge termination region each were set at 2800 μm in the simulation. Furthermore, the simulation conditions for the evaluation of the recovery characteristics were set such that $V_{cc}$ was 1000V, $J_A$ was 96.0 A/cm$^2$ and the temperature within the semiconductor device before occurrence of recovery was 398 K.

It can be found that thermal destruction occurs due to the temperature raised to approximately 770 to 800 K within the semiconductor device at the time point of about 5.6×10$^{-6}$ seconds as indicated by a point A in FIG. 19.

Figure 20:
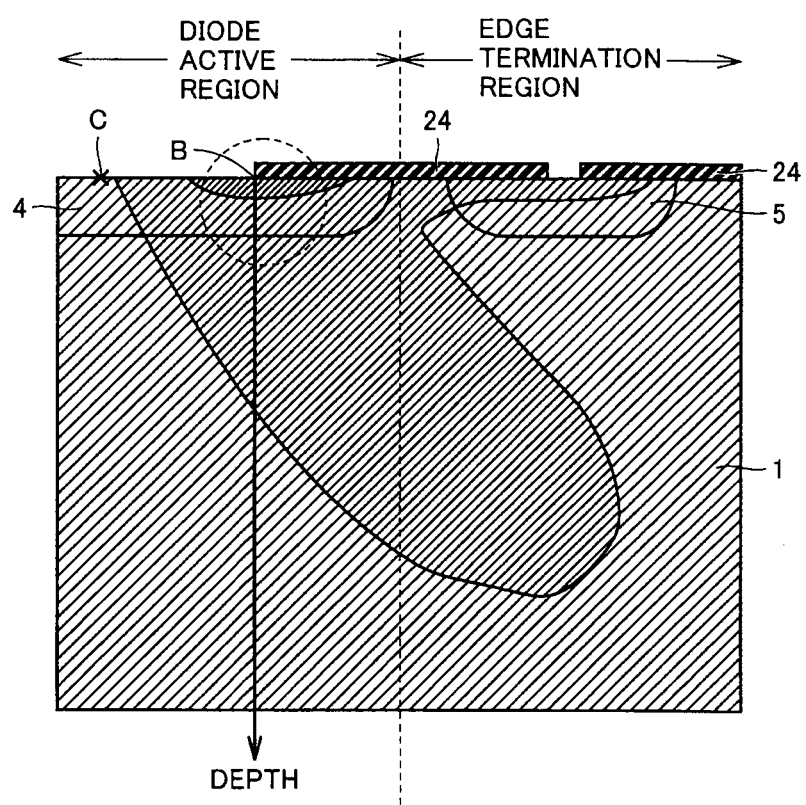
FIG. 20 is a schematic cross-sectional view showing the results of the simulation of the current density distribution during recovery within the model of the semiconductor device in the comparative example.

FIG. 20 shows only p-type regions 4 and 5 and oxide film 24 in the vicinity of the boundary region between the diode active region and the edge termination region in the semiconductor device according to the present embodiment, for example, shown in each of FIGS. 2, 7, 15, and the like. The simulation of the current distribution during recovery within the semiconductor device according to the comparative example and each Example was performed. As a result, it was found that the current value and the temperature each reach the maximum level particularly in the vicinity of a point B in FIG. 20 within the semiconductor device in the comparative example (in the vicinity of the boundary region between the diode active region and the edge termination region). Specifically, the current density is increased to about 1.0×10$^5$ A/cm$^2$ in the vicinity of point B in FIG. 20 while the temperature at point B is raised to about 900 K. Accordingly, thermal destruction may occur in the vicinity of point B.

Figure 21:
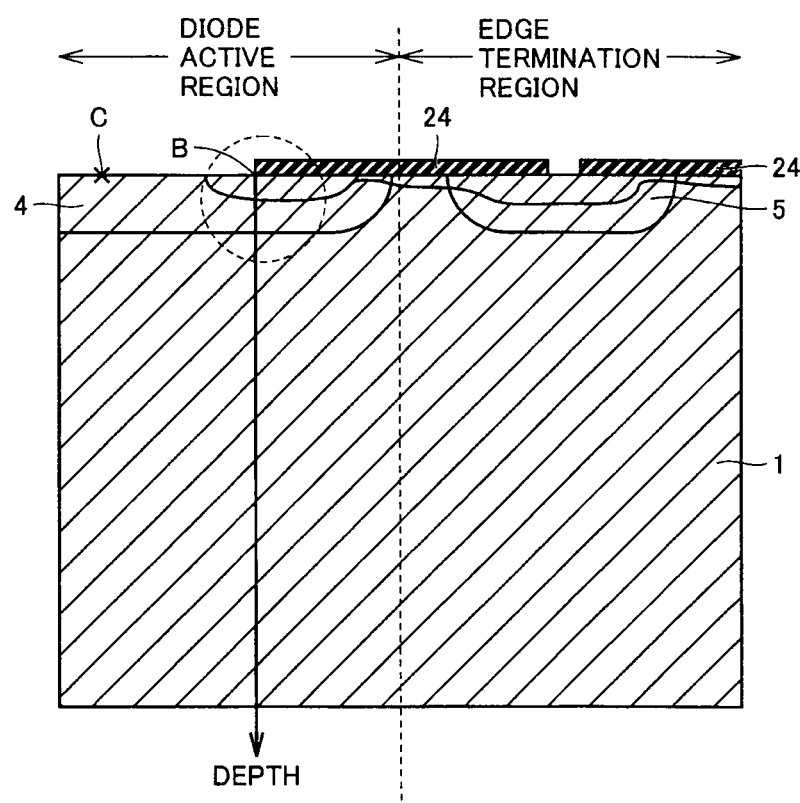
FIG. 21 is a schematic cross-sectional view showing the results of the simulation of the temperature distribution during recovery within the model of the semiconductor device in the first embodiment.
Figure 22:
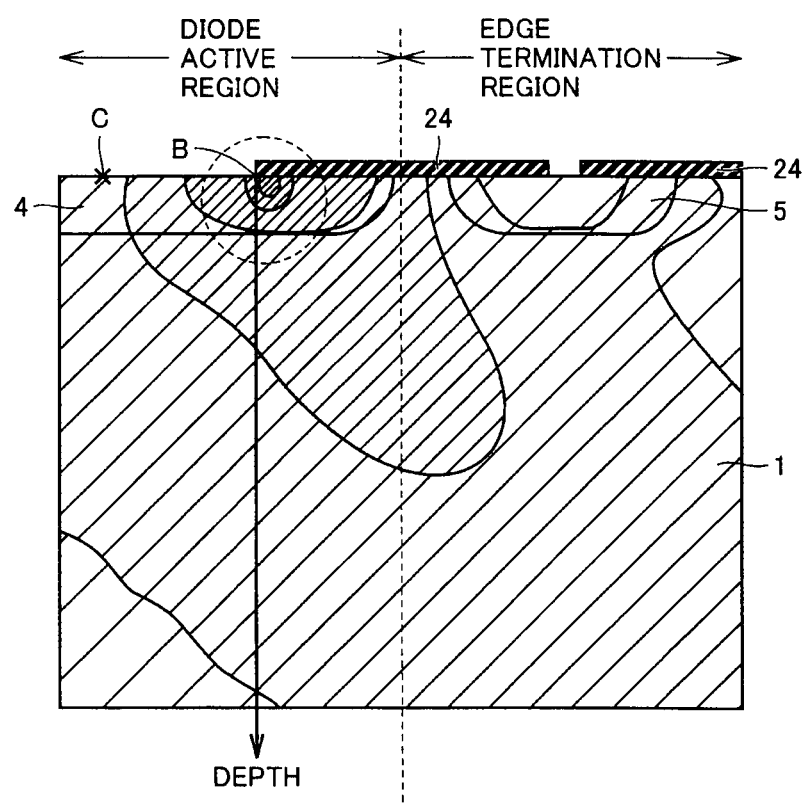
FIG. 22 is a schematic cross-sectional view showing the results of the simulation of the current density distribution during recovery within the model of the semiconductor device in the comparative example.
Figure 23:
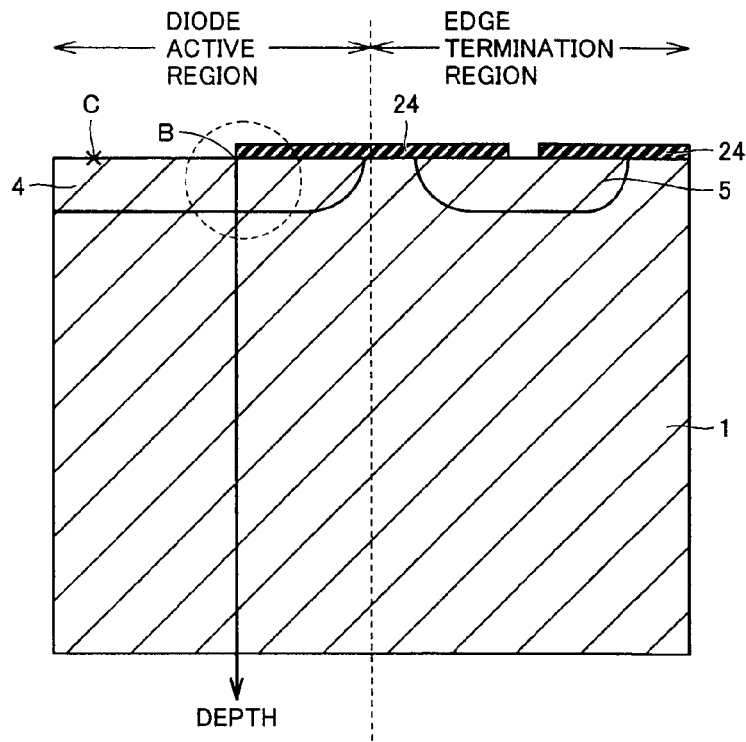
FIG. 23 is a schematic cross-sectional view showing the results of the simulation of the temperature distribution during recovery within the model of the semiconductor device in the first embodiment.

On the other hand, there is little increase in the current density and the temperature as described above in the semiconductor device according to the present Example. Specifically, the current density at point B is approximately 1.0× 10$^{1.575}$ A/cm$^2$ to 1.0×10$^{2.515}$ A/cm$^2$, and the temperature at point B is approximately 400 K. Furthermore, the current density within semiconductor substrate 1 is further decreased to approximately 1.0×10$^{0.6288}$ A/cm$^2$ to 1.0×10$^{-0.3144}$ A/cm$^2$. In FIGS. 20 and 22, the more densely the region is hatched, the higher the current density is. In FIGS. 21 and 23, more densely the region is hatched, the higher the temperature is.

Figure 24:
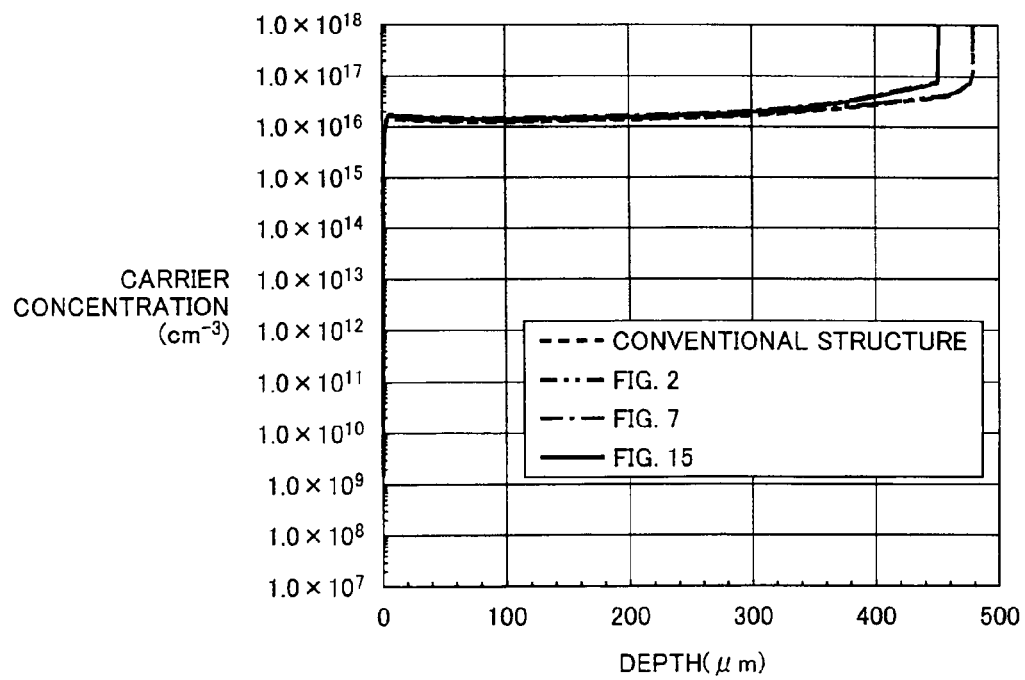
FIG. 24 is a graph showing the concentration of electrons in the region extending from a point C in the depth direction in FIG. 20 in the ON state.
Figure 25:
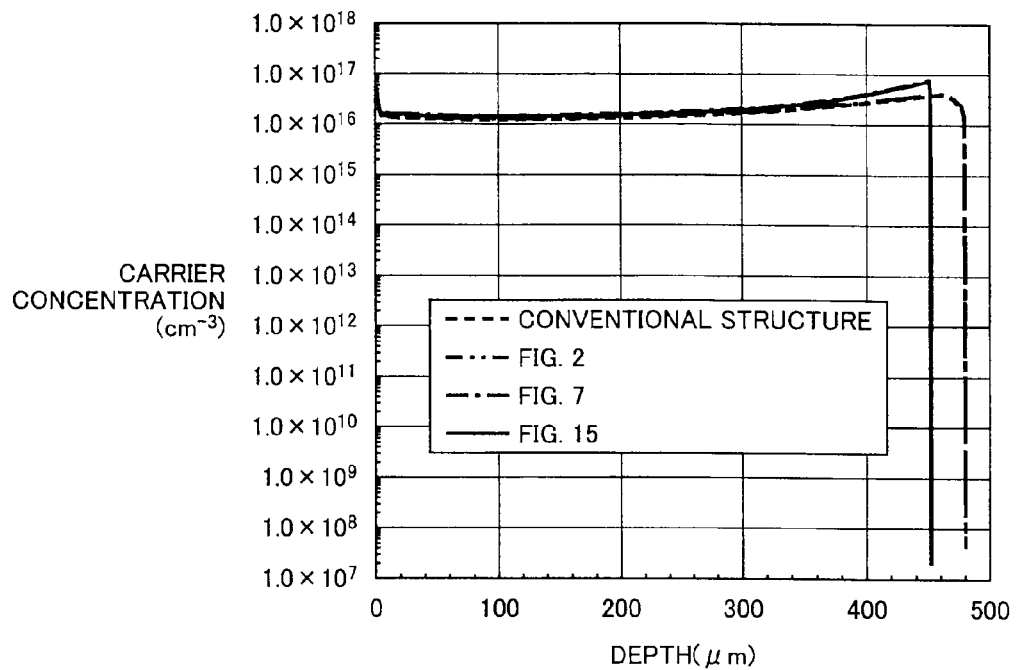
FIG. 25 is a graph showing the concentration of holes in the region extending from point C in the depth direction in FIG. 20 in the ON state.

FIGS. 24 to 25 as described below each show the carrier concentration in the region which extends from a point C in the depth direction in FIG. 20 (downward direction in the figure) in the ON state (at the time point of 5.0×10$^{-6}$ seconds in FIG. 19). In other words, in FIGS. 24 and 25, the depth of 0 μm in the horizontal axis corresponds to point C while the depth of 100 μm corresponds to a point at a distance of 100 μm from point C in the downward direction in FIG. 20.

Figure 26:
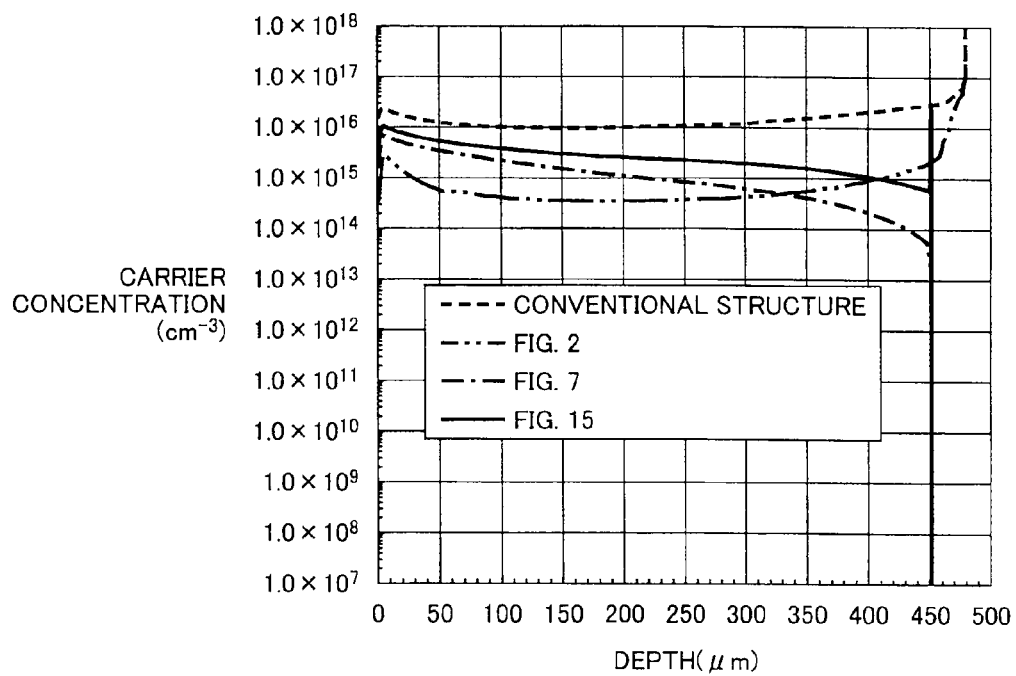
FIG. 26 is a graph showing the concentration of electrons in the region extending from a point B in the depth direction in FIG. 20 in the ON state.
Figure 27:
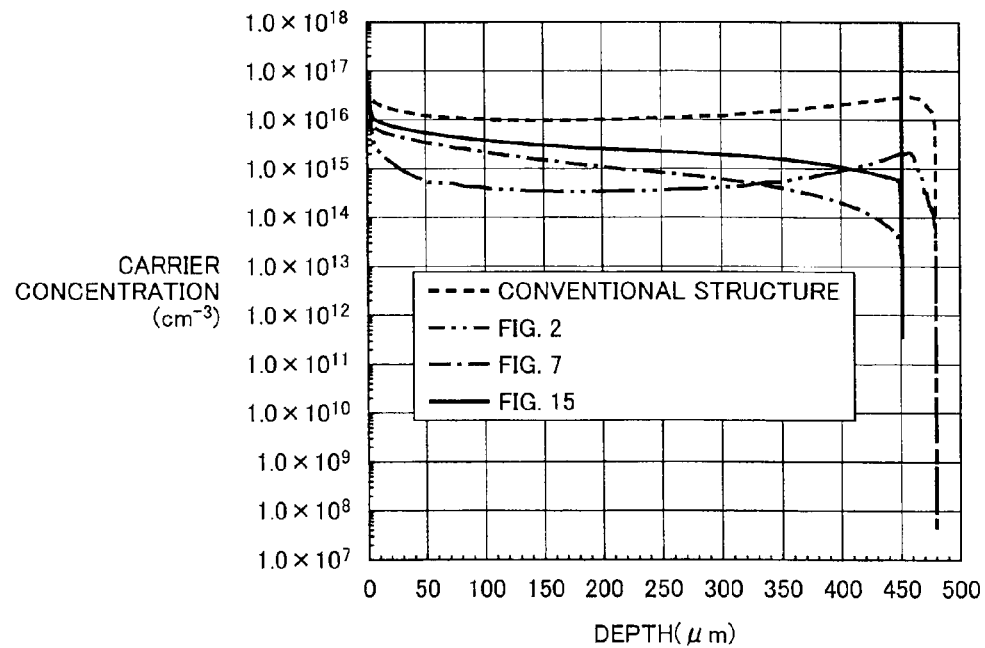
FIG. 27 is a graph showing the concentration of holes in the region extending from point B in the depth direction in FIG. 20 in the ON state.
Figure 28:
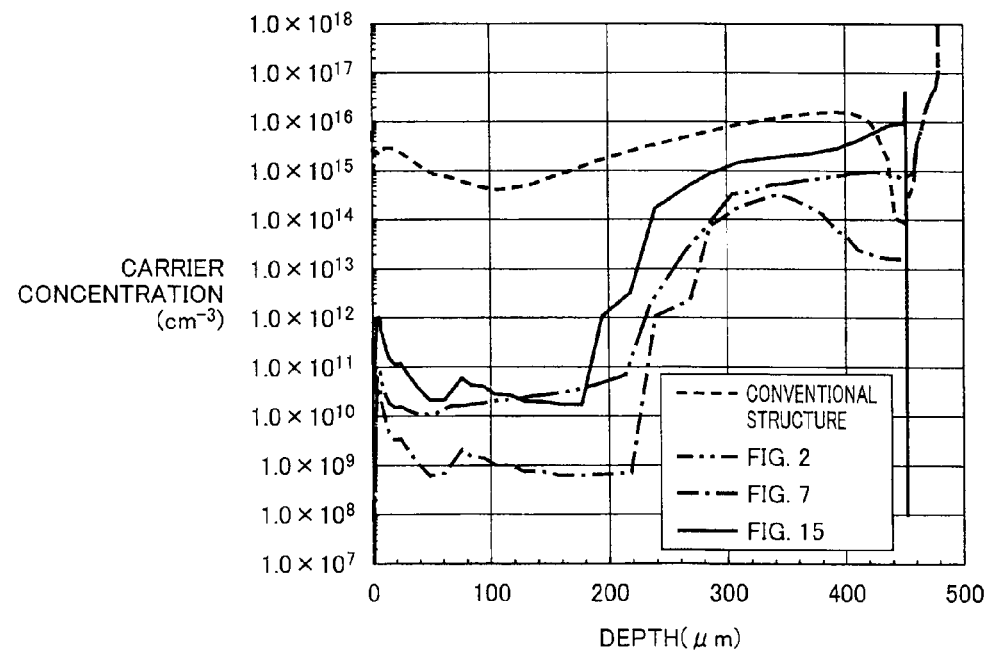
FIG. 28 is a graph showing the concentration of electrons in the region extending from point B in the depth direction in FIG. 20 during recovery.
Figure 29:
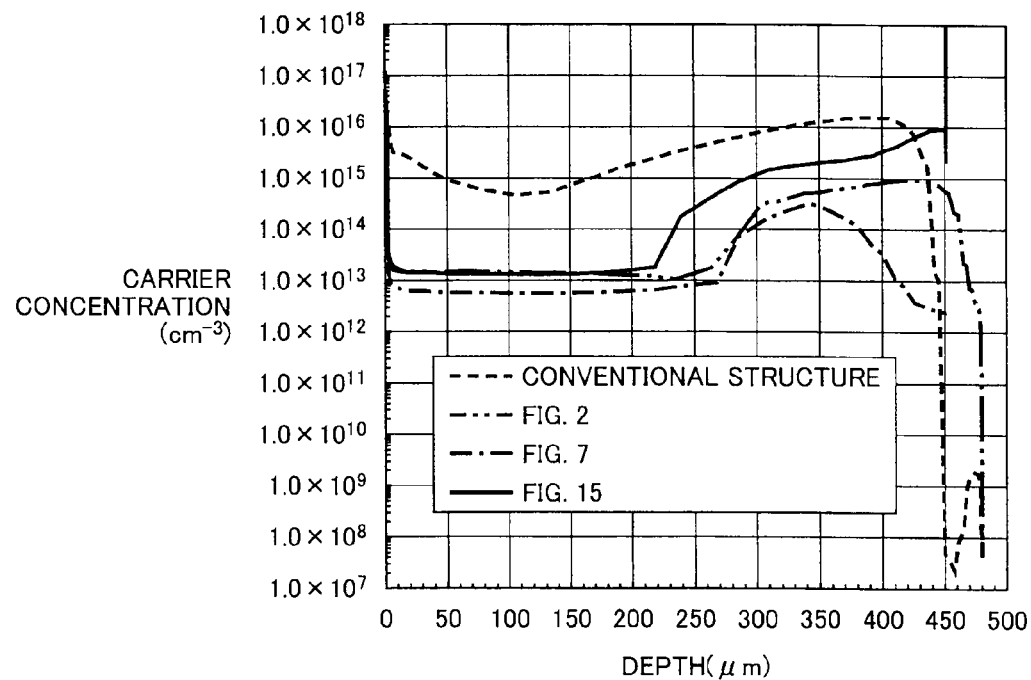
FIG. 29 is a graph showing the concentration of holes in the region extending from point B in the depth direction in FIG. 20 during recovery.

In contrast, FIGS. 26 and 27 each show the carrier concentration in the region which extends from point B in the depth direction in FIG. 20 (in the downward direction in the figure) in the ON state (at the time point of 5.0×10$^{-6}$ seconds in FIG. 19). Furthermore, FIGS. 28 and 29 each show the carrier concentration in the region which extends from point B in the depth direction in FIG. 20 (in the downward direction in the figure) during recovery (at the time of point A in FIG. 19).

Referring to FIGS. 24 and 25, there is little change in the carrier concentration in the diode active region of the semiconductor device in each of the conventional structure (FIG. 5), Example 1 (FIG. 2), Example 2 (FIG. 7), and Example 3 (FIG. 15).

Accordingly, in the semiconductor device according to each of the conventional example and the present Examples, there is no change in the carrier concentration in the ON state at point C and directly therebelow, that is, in the diode active region distant from the edge termination region. In other words, there is little difference between $V_F$ of the diode of the semiconductor device in each of the present Examples and $V_F$ of the diode of the semiconductor device in the conventional example.

Referring to FIGS. 26 and 27, the carrier concentration in each Example is decreased in the region corresponding to each of point B and directly therebelow, as compared with the conventional structure. The same results are shown also in FIGS. 28 and 29.

Accordingly, it is found that each configuration of the present Examples is applied to thereby allow suppression of the current concentration in the vicinity of the boundary region between the diode active region and the edge termination region both in the ON state and during recovery. In other words, the current value can be reduced by reducing the number of carriers flowing back and forth between the diode active region and the edge termination region. Consequently, thermal destruction caused by increased temperature in the vicinity of the boundary region can be suppressed.

Figure 30:
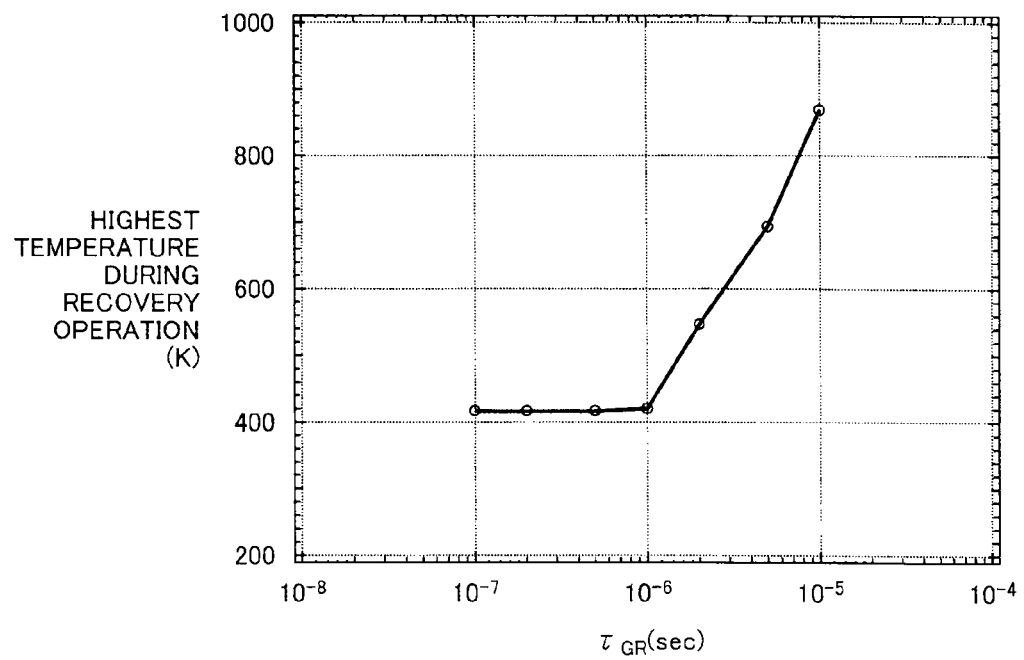
FIG. 30 is a graph showing the relationship between the carrier lifetime in an edge termination region and the highest temperature in the semiconductor device.

For example, the horizontal axis in FIG. 30 represents carrier lifetime $\tau_{GR}$ in the edge termination region of the semiconductor device in FIG. 2, while the vertical axis in FIG. 30 represents the highest temperature during recovery of the semiconductor device. FIG. 30 shows that thermal destruction of the semiconductor device can be suppressed by reducing $\tau_{GR}$.

Figure 31:
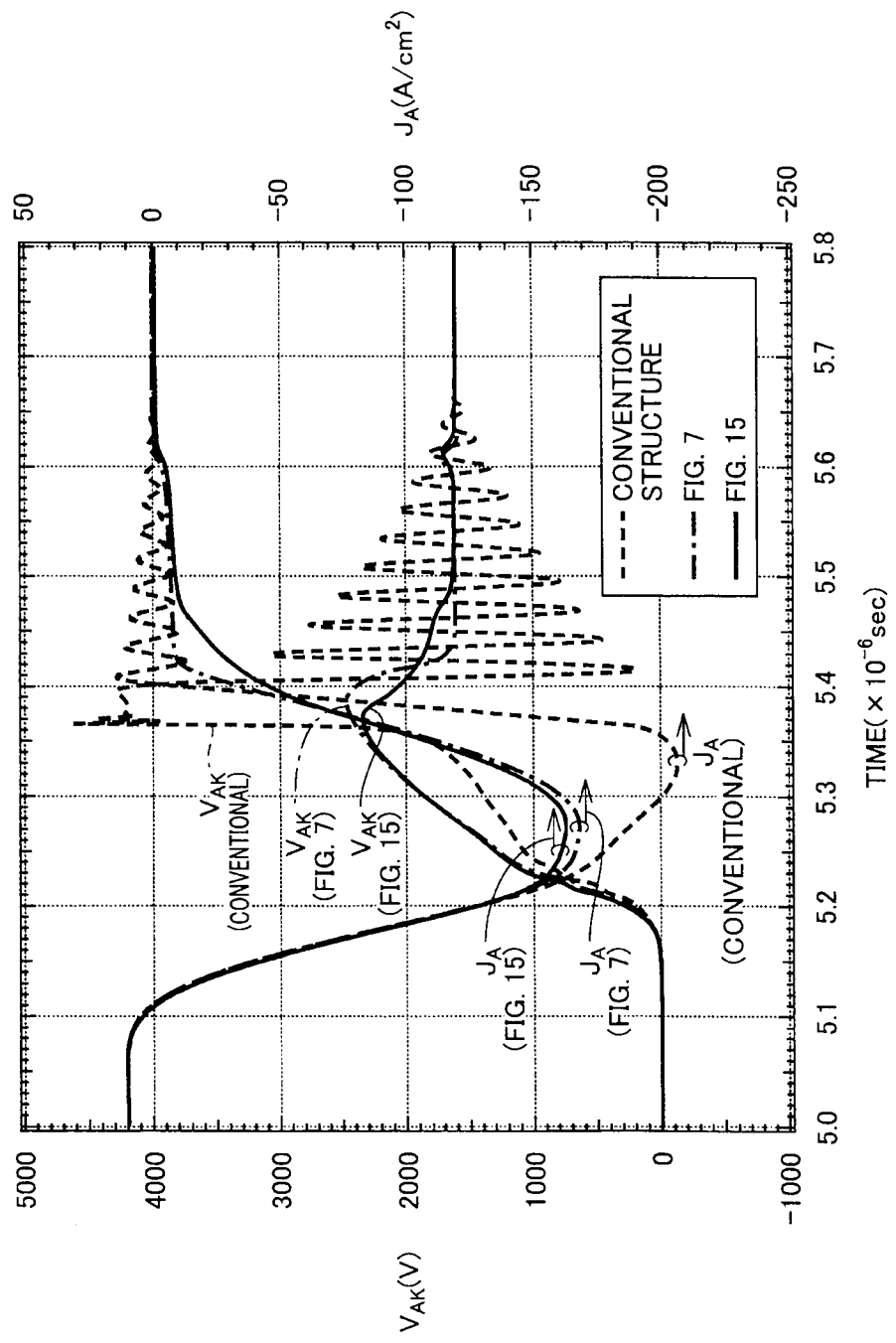
FIG. 31 is a graph showing an example of the simulation of the waveform of the oscillation characteristics during recovery in the diode in each of the conventional example and Examples.

Referring to FIG. 31, the simulations were performed for the present Examples and the comparative example with regard to the oscillation characteristics and change over time of voltage $V_{AK}$ and current density $J_A$ during recovery as in FIG. 19. The simulation conditions in this case were set such that $V_{cc}$ was 1600 V, $J_A$ was 9.6 A/cm², and the temperature within the semiconductor device before occurrence of recovery was 298 K. Furthermore, coil LM was set at 2.0 µH. Examples 2 and 3 of the present embodiment each show that there is suppression of oscillation of each of $V_{AK}$ and $J_A$ at the time of recovery during which $J_A$ is reversed. Suppression of the oscillation by the structure of the conventionally used diode requires an increase in thickness $t_3$. This causes deterioration in the trade-off characteristics between $V_F$ and $E_{REC}$ of the diode.

Figure 32:
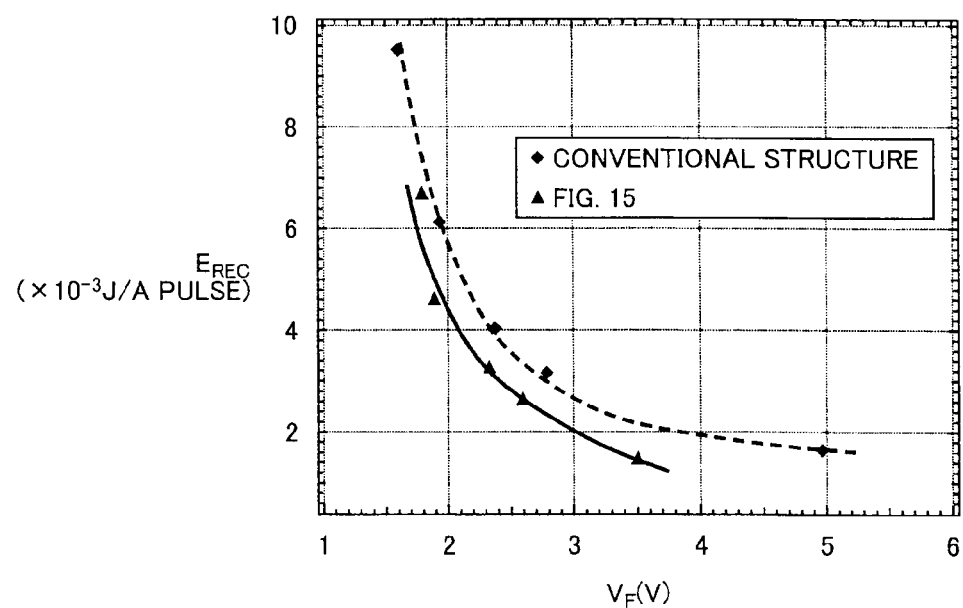
FIG. 32 is a graph showing comparison of $V_F$-$E_{REC}$ trade-off characteristics of the diode in the conventional example and Examples.

Referring to FIG. 32, in the semiconductor device according to Example 3 of the present embodiment, the value of each of $V_F$ and $E_{REC}$ is decreased as a whole as compared with the case in the semiconductor device having the conventional structure. Accordingly, it can be found that the semiconductor device according to each of the present Examples is improved in trade-off characteristics between $V_F$ and $E_{REC}$ as compared with the semiconductor device having the conventional structure.

FIGS. 24 to 32 as described above show improvement in the characteristics of the semiconductor device by the present embodiment.

Second Embodiment

The semiconductor device according to the present embodiment is different in the anode configuration from the semiconductor device according to the first embodiment. The present embodiment will be hereinafter described.

Figure 33:
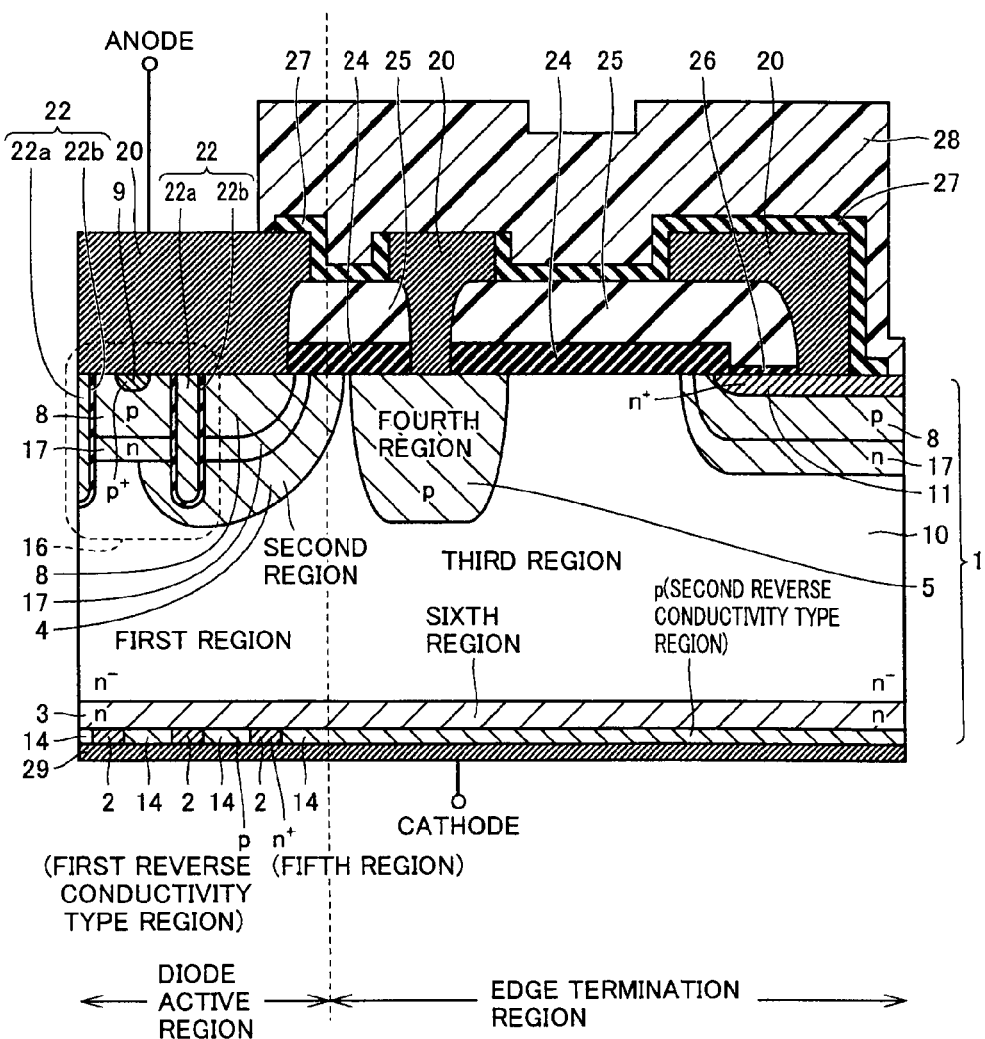
FIG. 33 is a schematic cross-sectional view of the semiconductor device according to Example 1 in the second embodiment.

Referring to FIG. 33, a p-type diffusion layer 8, an n-type diffusion layer 17, a trench structure 22, and a p⁺ diffusion layer 9 are formed on the anode side of the diode active region in the semiconductor device according to Example 1 of the present embodiment.

As with p-type regions 4 and 5, n-type diffusion layer 17 is a region of an n-type formed on the first main surface side of n⁻ drift layer 10. P-type diffusion layer 8 is a region of a p-type formed on the first main surface side of n-type diffusion layer 17. P-type diffusion layer 8 and n-type diffusion layer 17 are formed also on the underside of n⁺ region 11 in the edge termination region. Trench structure 22 has a trench extending from the first main surface through p-type diffusion layer 8 and n-type diffusion layer 17 in semiconductor substrate 1. Trench structure 22 includes a material insulation film 22b formed along the inner wall of the trench and a material electrode 22a filling the trench.

Furthermore, p-type diffusion layer 8 has a surface concentration of $1\times10^{16}$ to $1\times10^{18}$ cm⁻³ and a depth of 1 to 4 µm, for example. The peak concentration of the impurities in n-type diffusion layer 17 is greater than or equal to the concentration of the impurities in n⁻ drift layer 10, and less than or equal to the peak value of the impurity concentration in p-type diffusion layer 8.

It is preferable that the electrical potential of material electrode 22a is set to the level equal to the electrical potential of anode electrode 20 located directly above trench structure 22. This allows a desired voltage to be applied to anode electrode 20 using material electrode 22a filled in semiconductor substrate 1.

The configuration of the semiconductor device in FIG. 33 is approximately the same as that of the semiconductor device in FIG. 15 (Example 3 in the first embodiment) except for the above-described configuration. Accordingly, the components in FIG. 33 identical to those in FIG. 15 are designated by the same reference characters, and description thereof will not be repeated.

Then, the functions and effects of the present semiconductor device will be described.

The semiconductor device according to the present embodiment also has the effects similar to those of the semiconductor device according to each Example in the first embodiment. In addition, in the present embodiment, trench structure 22 functioning similarly as a field plate structure is disposed. Accordingly, a voltage in the reverse direction is applied to the diode active region, which facilitates extension of the depletion layer from the junction between p-type diffusion layer 8 and n-type diffusion layer 17 located between a pair of trench structures 22. Therefore, the maximum cut-off voltage $V_{RRM}$ can be maintained.

Furthermore, for example, in the conventional diode and the diode of the first embodiment, the carrier lifetime is employed a parameter to control the trade-off characteristics between recovery loss $E_{REC}$ and $V_F$. In contrast, according to the present embodiment, the concentration of p-type diffusion layer 8 is adjusted to thereby control the trade-off characteristics to expand the range in which the trade-off characteristics can be controlled, and the carrier lifetime adjustment process is eliminated, with the result that the wafer process can be simplified.

Furthermore, n-type diffusion layer 17 allows the amount of the holes injected from p-type diffusion layer 8 in the ON state to be controlled.

It is to be noted that the configuration including trench structure 22 and the like as in FIG. 33 is combined with Examples 1 and 2 of the first embodiment, which also allows the similar effects to be achieved.

Then, the semiconductor device according to Example 2 in the present embodiment that is different from the semiconductor device in FIG. 33 will be hereinafter described.

Figure 34:
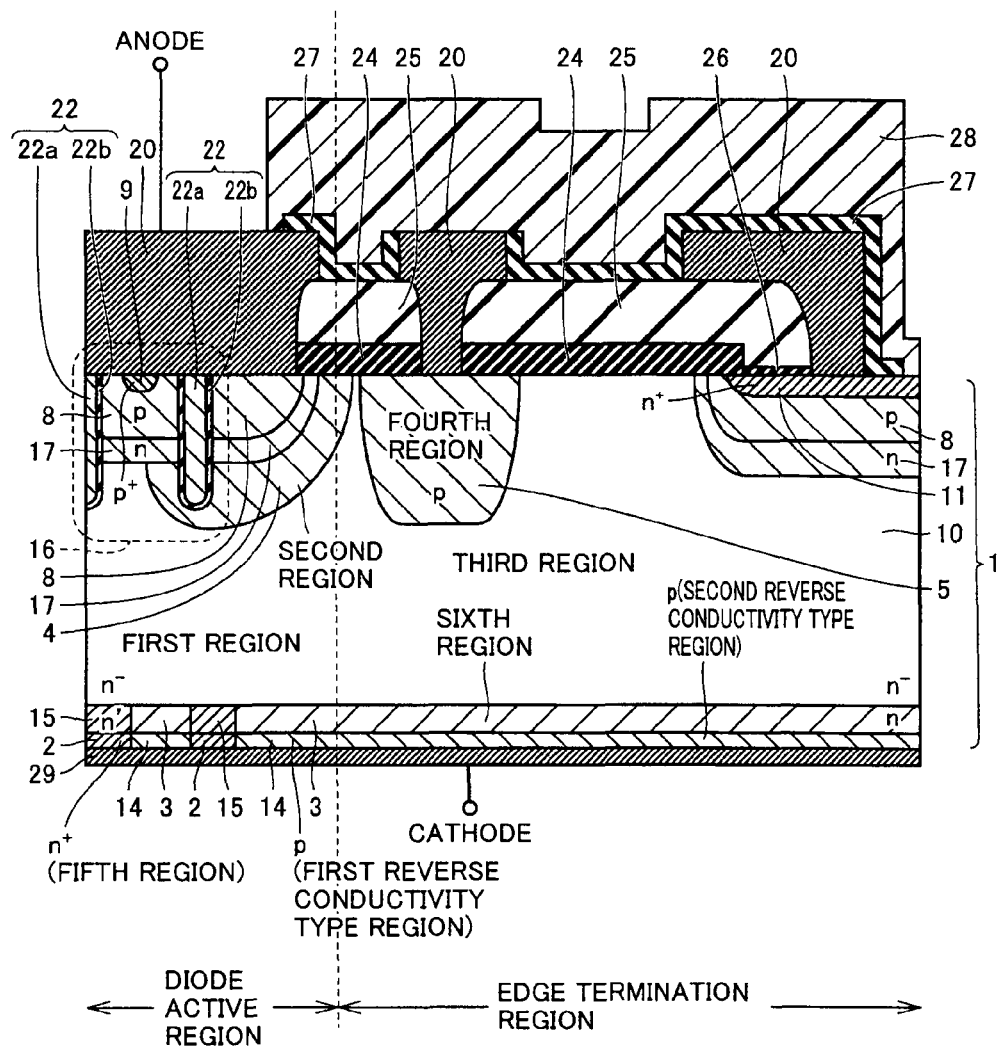
FIG. 34 is a schematic cross-sectional view of the semiconductor device according to Example 2 in the second embodiment.

Referring to FIG. 34, the semiconductor device according to Example 2 in the present embodiment is different in the cathode configuration in the diode active region from the semiconductor device in Example 1 in FIG. 33. Specifically, the n layer above n⁺ layer 2 and p-type layer 14 includes an n' layer 15 which is a region of an n-type and located directly above n⁺ layer 2 (the fifth region), and n-type layer 3 which is a region of an n-type and located directly above p-type layer 14 (the first reverse conductivity type region). In this case, n' layer 15 is indicated by n' in FIG. 34.

Furthermore, n' layer 15 is different in the concentration of n-type impurities from n-type layer 3. Specifically, the peak concentration of the impurities in n-type layer 3 is the same as the peak concentration of the impurities in n-type layer 3 in FIG. 33. In contrast, the peak concentration of the impurities in n' layer 15 is higher than the peak concentration of the impurities in n-type layer 3. Specifically, the peak concentration of n' layer 15 is $1\times10^{17}$ to $1\times10^{18}$ cm$^{-3}$.

The configuration of the semiconductor device in FIG. 34 is almost the same as that of the semiconductor device in FIG. 33 except for the above-described configuration. Therefore, the components in FIG. 33 identical to those in FIG. 15 are designated by the same reference characters, and description thereof will not be repeated.

Then, the functions and effects of the present semiconductor device will be described.

The semiconductor device according to the present embodiment also has the effects similar to those of the semiconductor device according to each Example in the first embodiment and Example 1 in the second embodiment. In addition, in the present embodiment, the impurity concentration of n' layer 15 above n$^+$ layer 2 is higher than the impurity concentration of n-type layer 3 above p-type layer 14. In the state where the diode is ON, this brings about the state similar to that in which a reverse voltage is applied between n' layer 15 and n-type layer 3. Accordingly, $V_F$ of the diode can be decreased.

Figure 35:
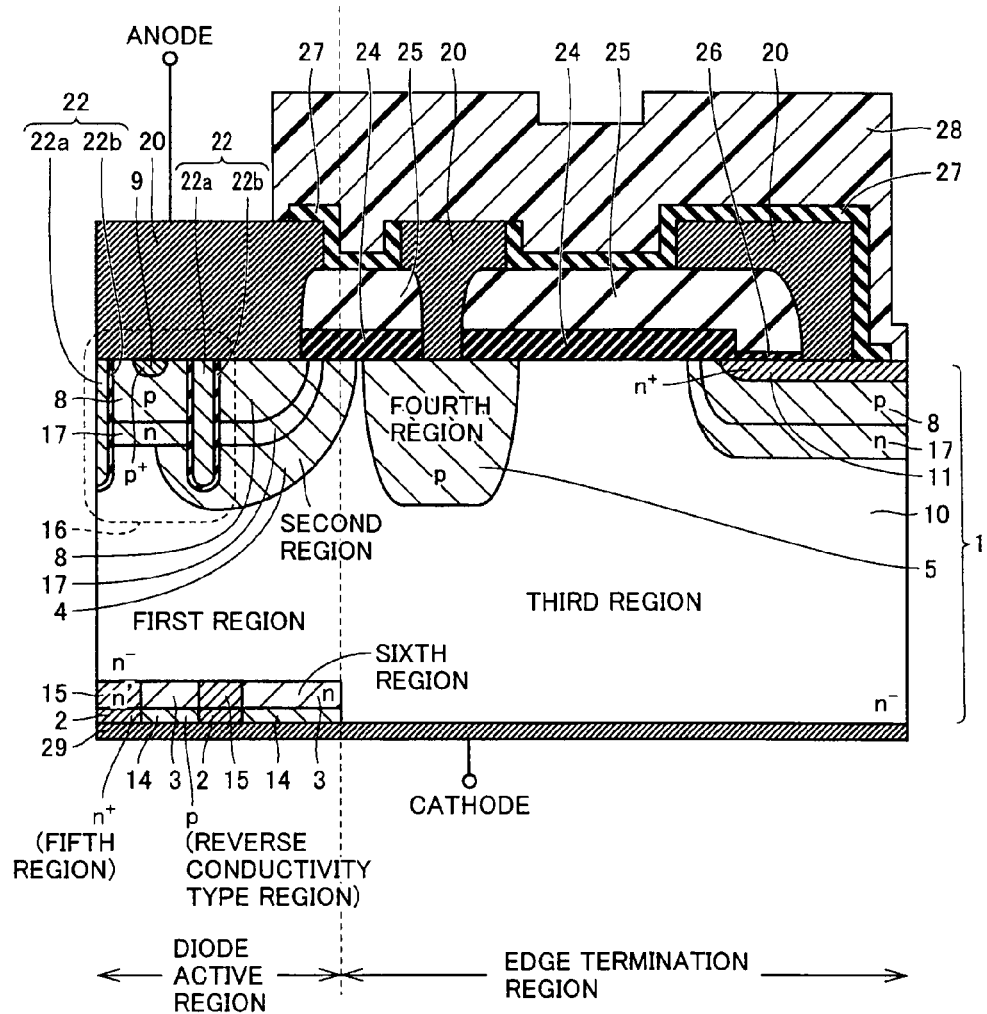
FIG. 35 is a schematic cross-sectional view of the semiconductor device according to Example 3 in the second embodiment.
Figure 36:
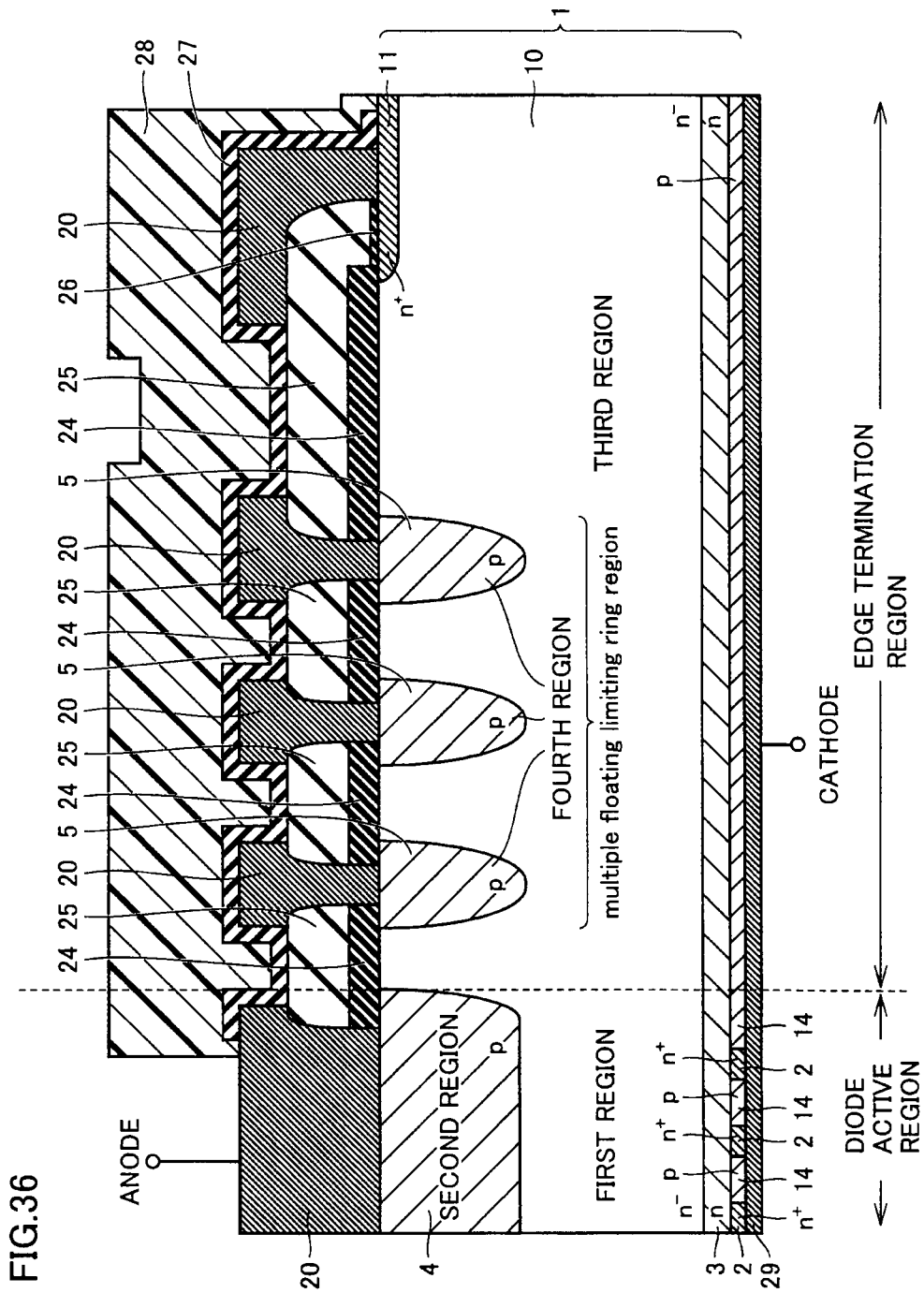
FIG. 36 is a schematic cross-sectional view of the semiconductor device according to Example 1 in the third embodiment.
Figure 37:
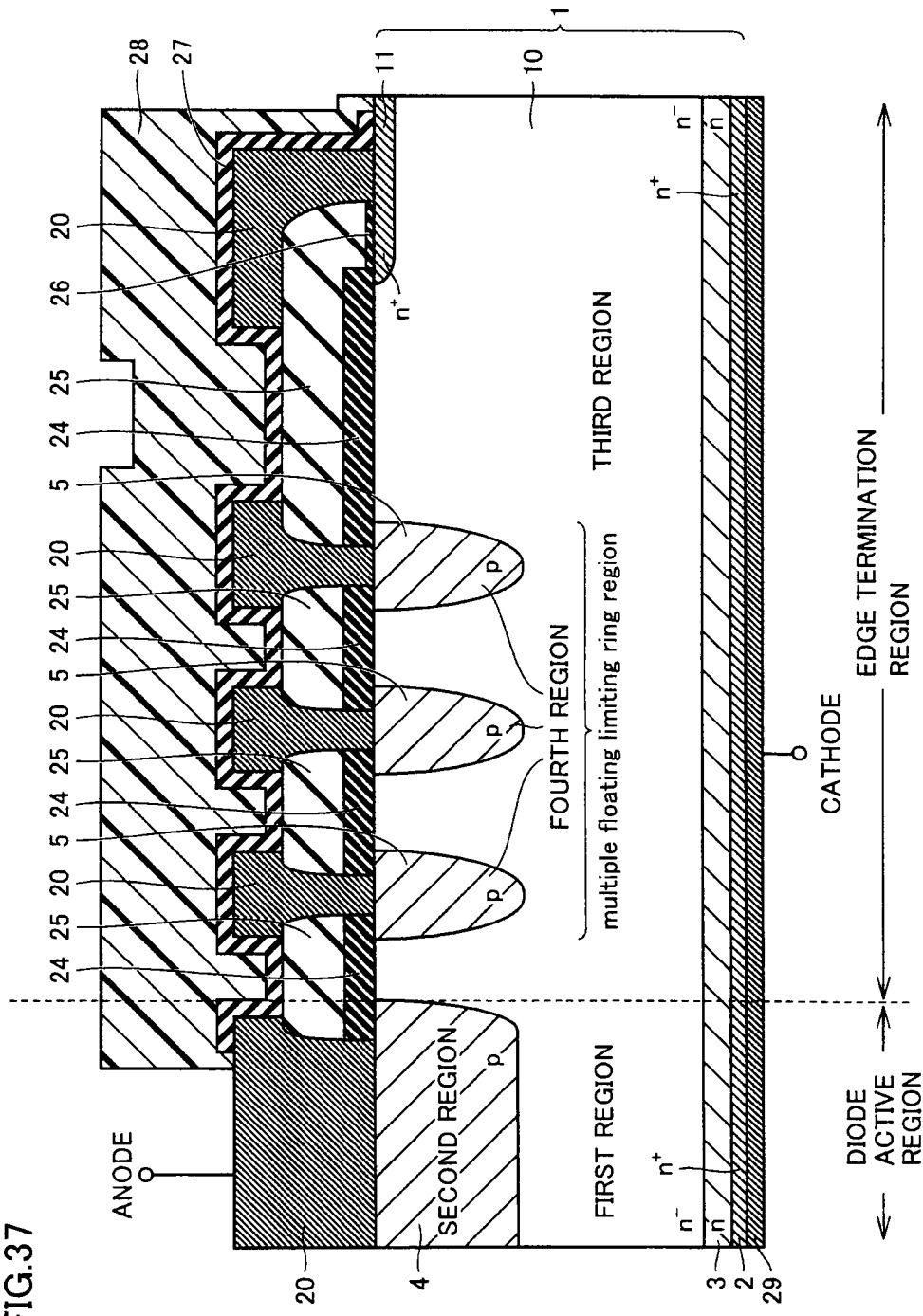
FIG. 37 is a schematic cross-sectional view of the semiconductor device according to Example 2 in the third embodiment.
Figure 38:
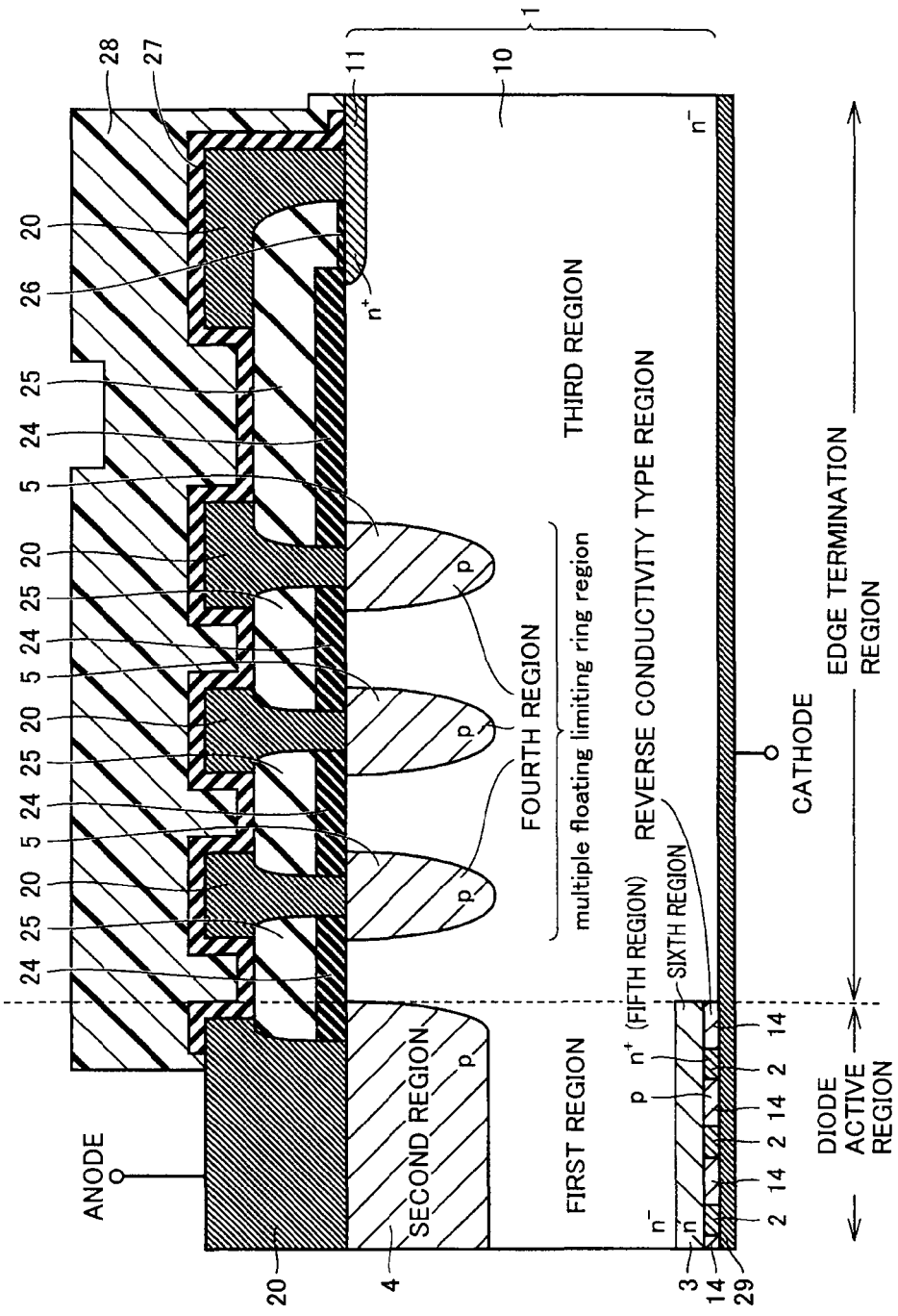
FIG. 38 is a schematic cross-sectional view of the semiconductor device according to Example 3 in the third embodiment.
Figure 39:
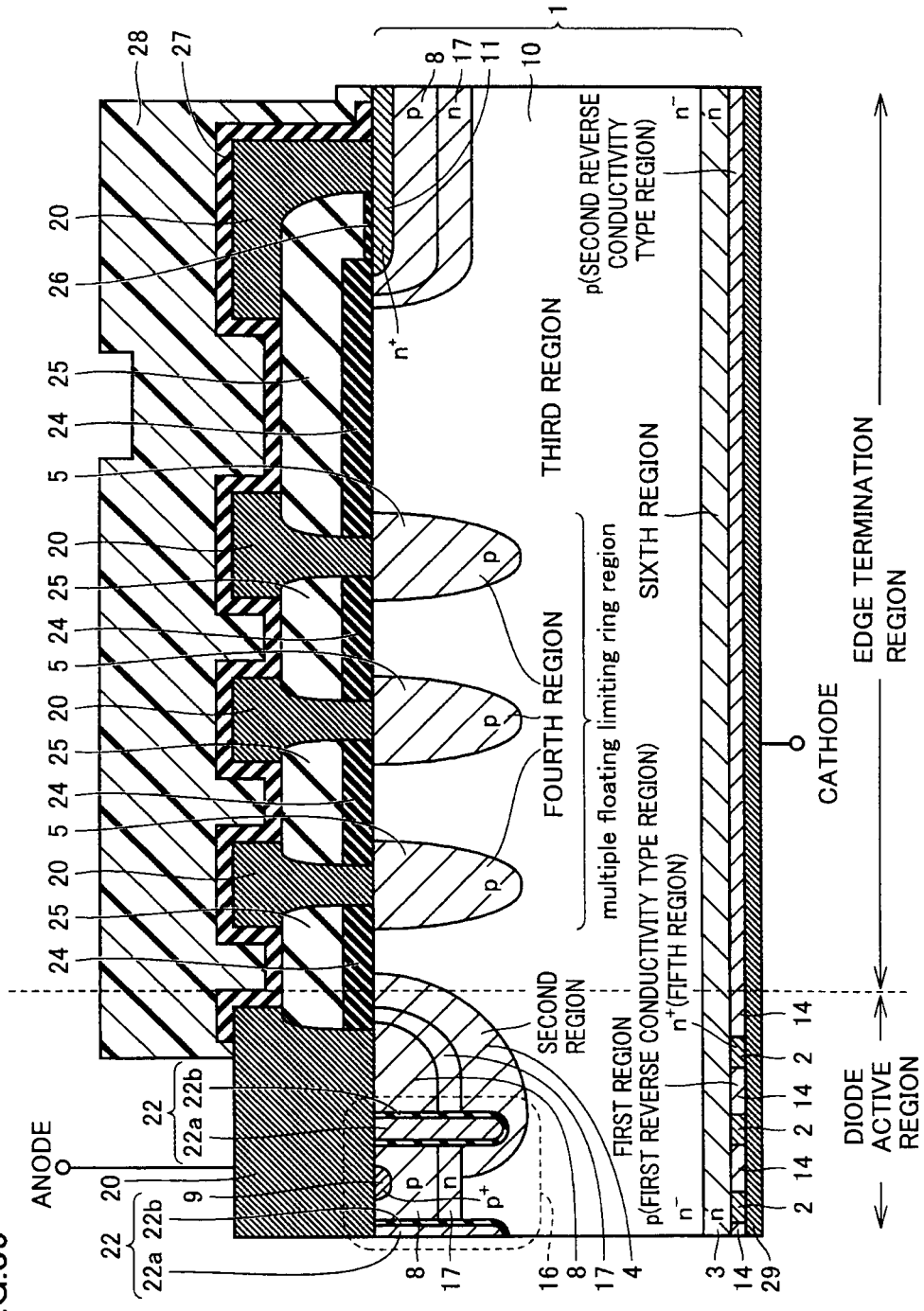
FIG. 39 is a schematic cross-sectional view of the semiconductor device according to Example 4 in the third embodiment.
Figure 40:
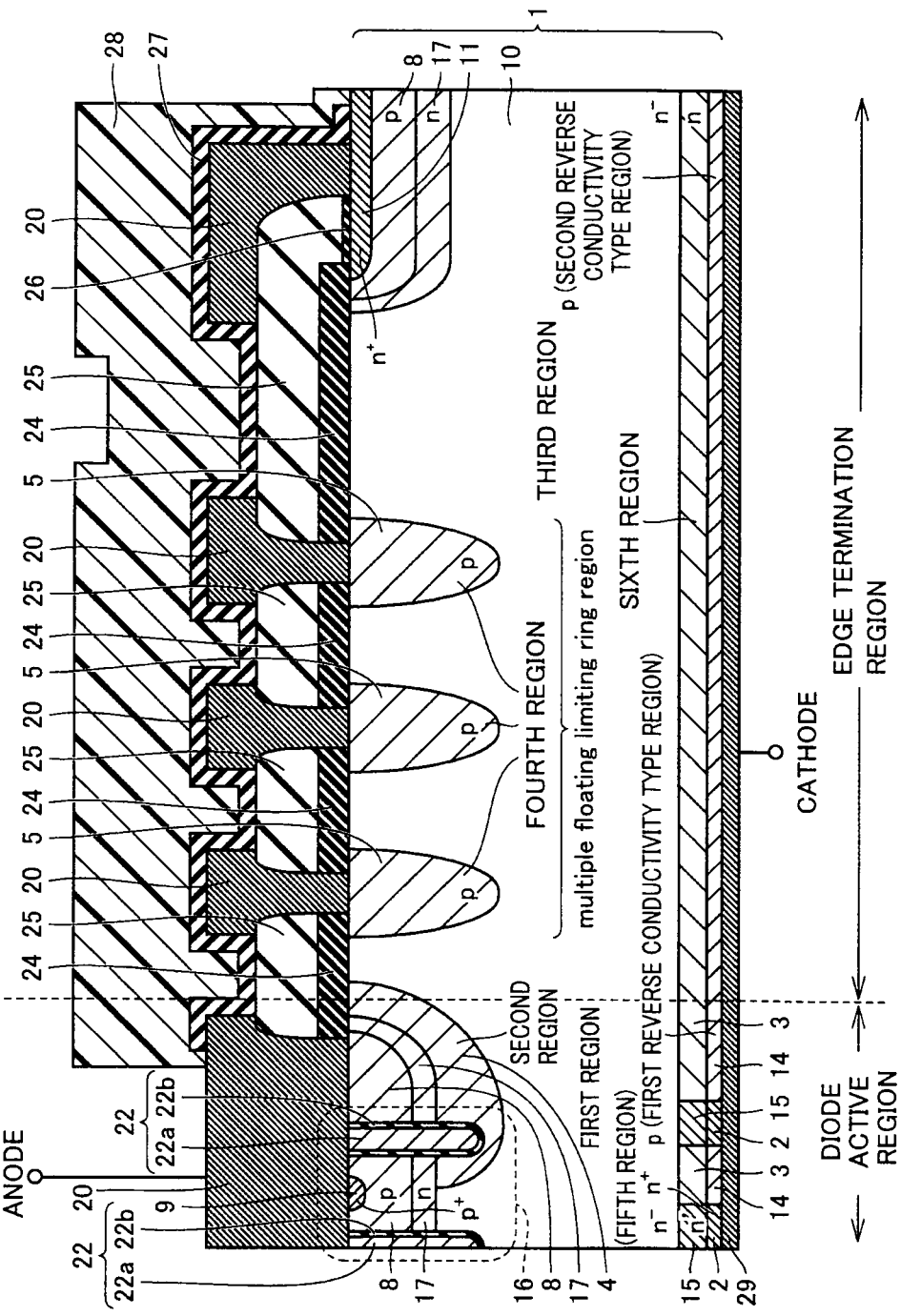
FIG. 40 is a schematic cross-sectional view of the semiconductor device according to Example 5 in the third embodiment.
Figure 41:
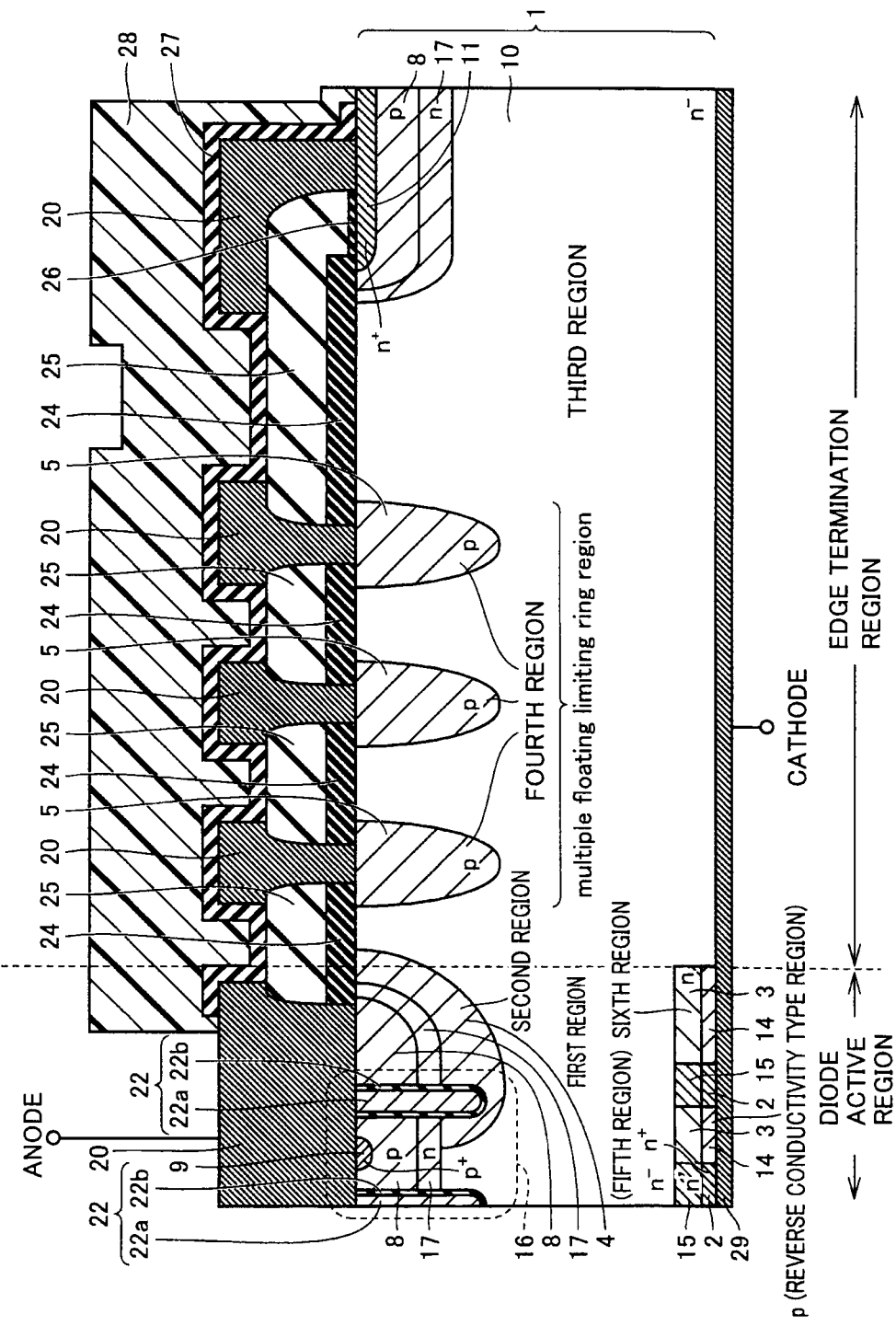
FIG. 41 is a schematic cross-sectional view of the semiconductor device according to Example 6 in the third embodiment.
Figure 42:
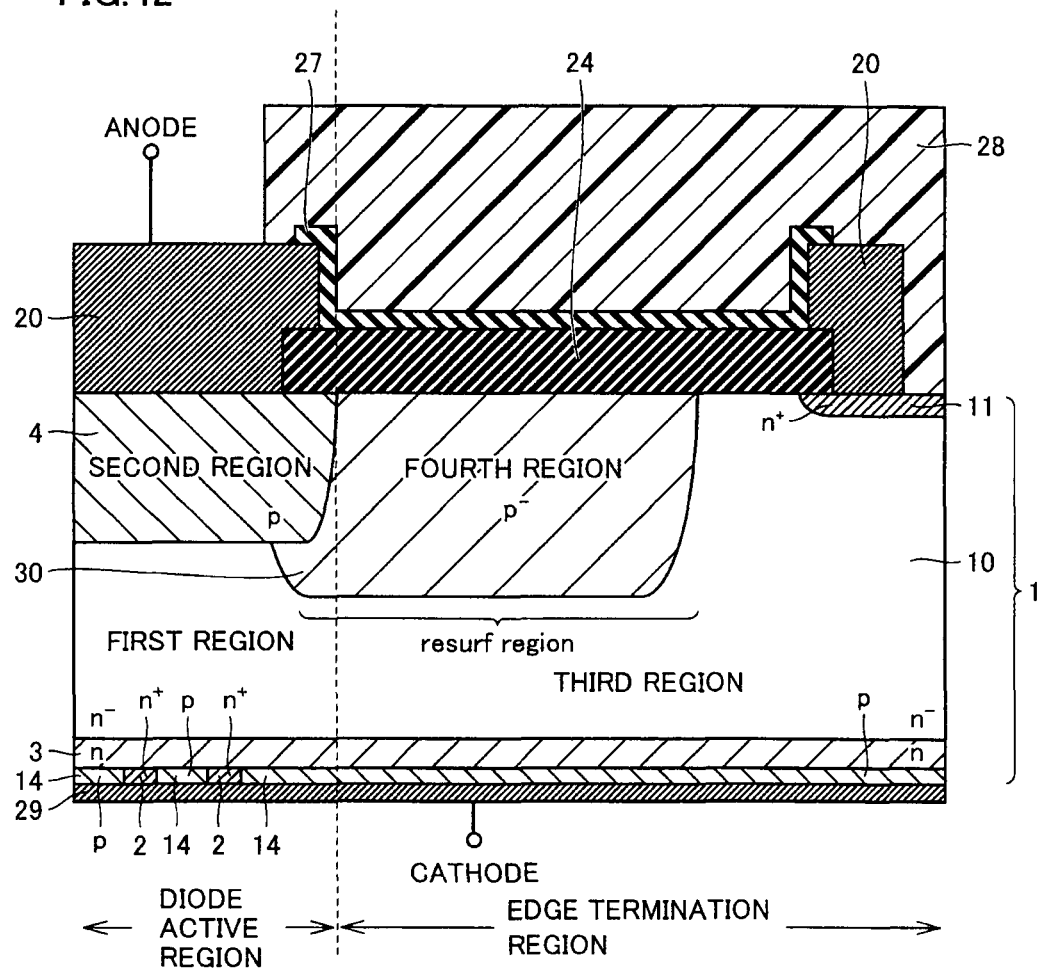
FIG. 42 is a schematic cross-sectional view of the semiconductor device according to Example 1 in the fourth embodiment.
Figure 43:
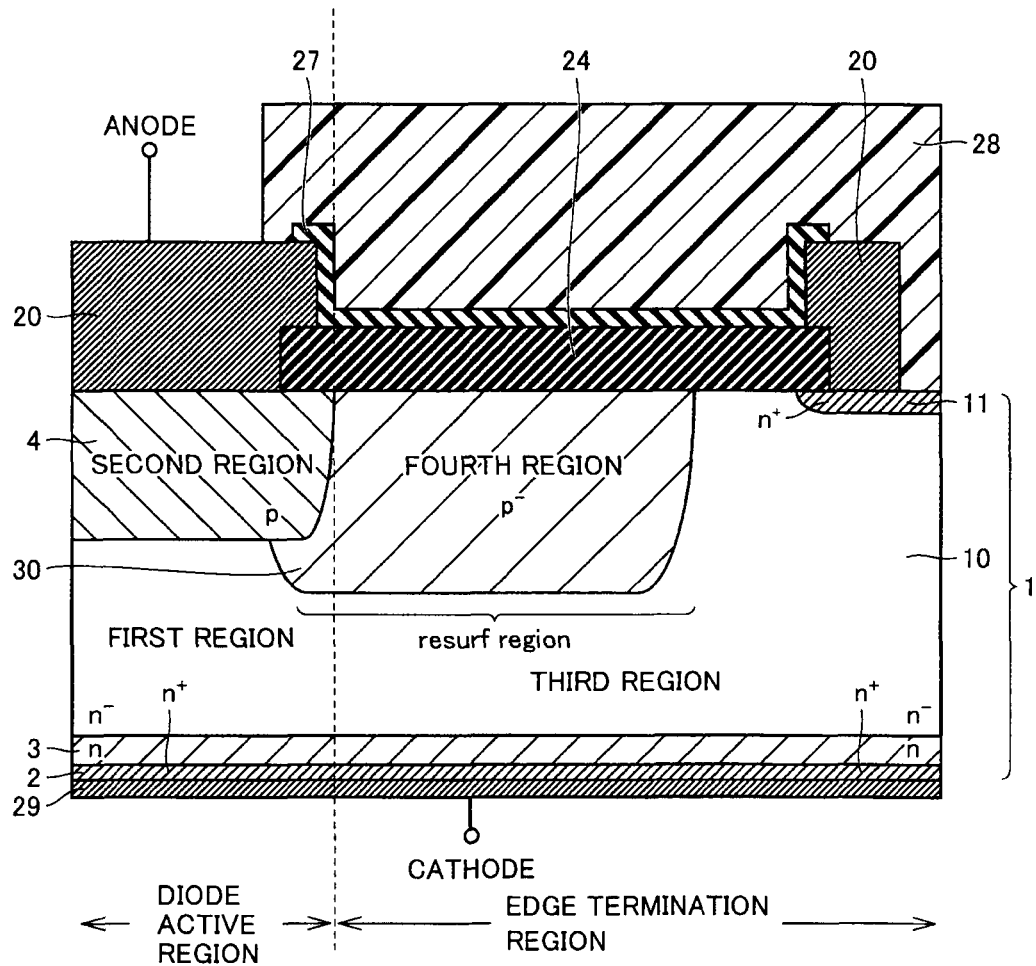
FIG. 43 is a schematic cross-sectional view of the semiconductor device according to Example 2 in the fourth embodiment.
Figure 44:
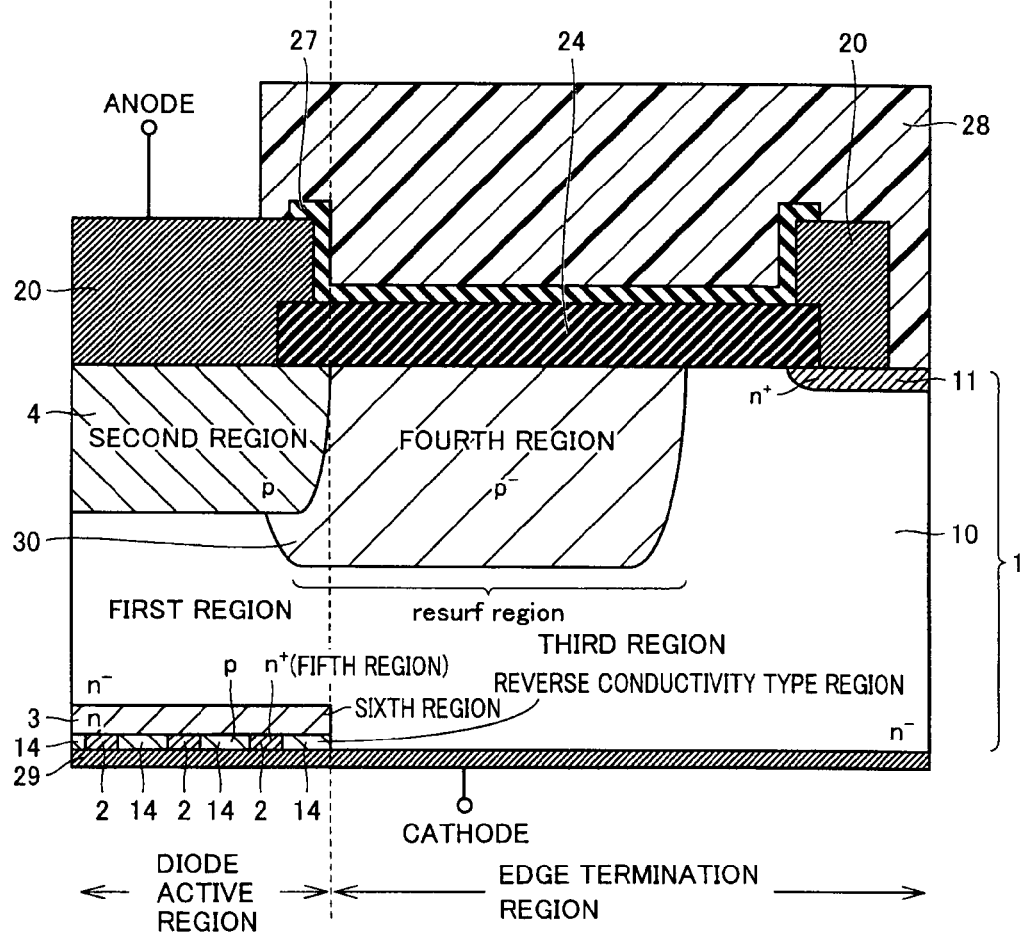
FIG. 44 is a schematic cross-sectional view of the semiconductor device according to Example 3 in the fourth embodiment.
Figure 45:
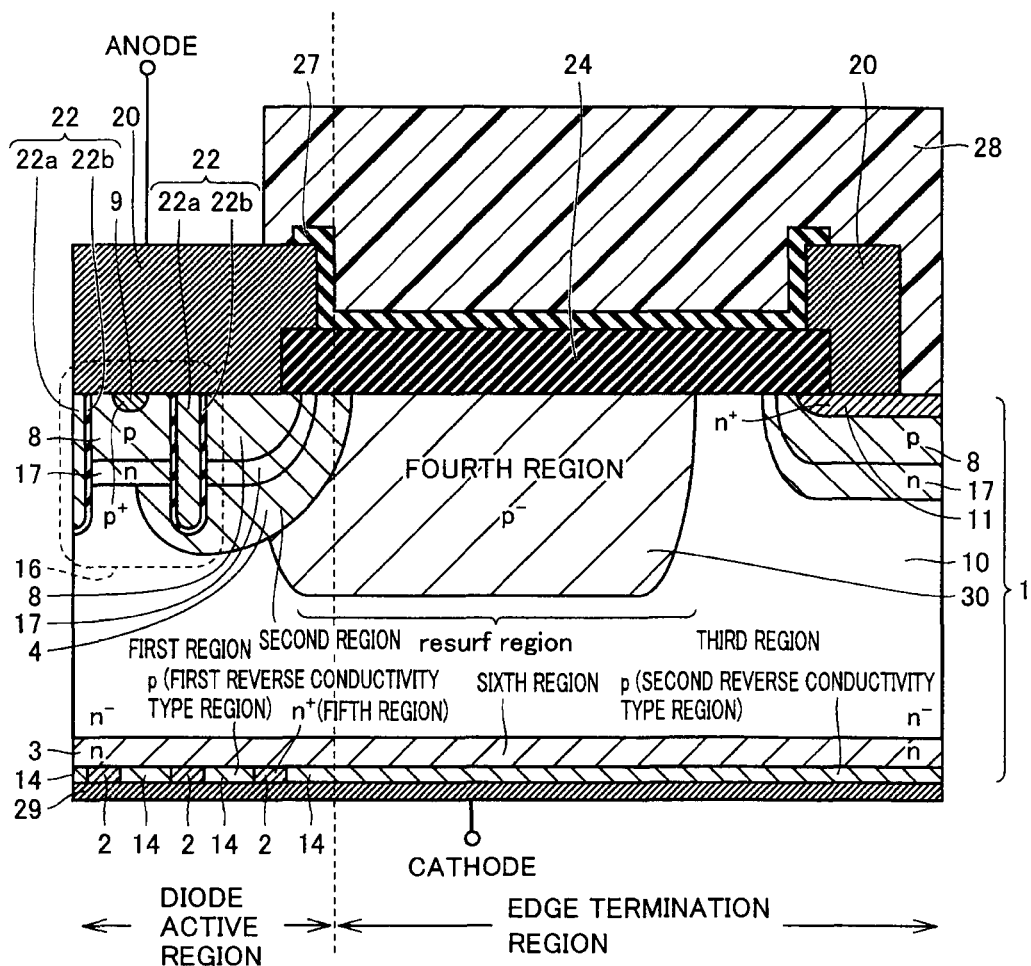
FIG. 45 is a schematic cross-sectional view of the semiconductor device according to Example 4 in the fourth embodiment.
Figure 46:
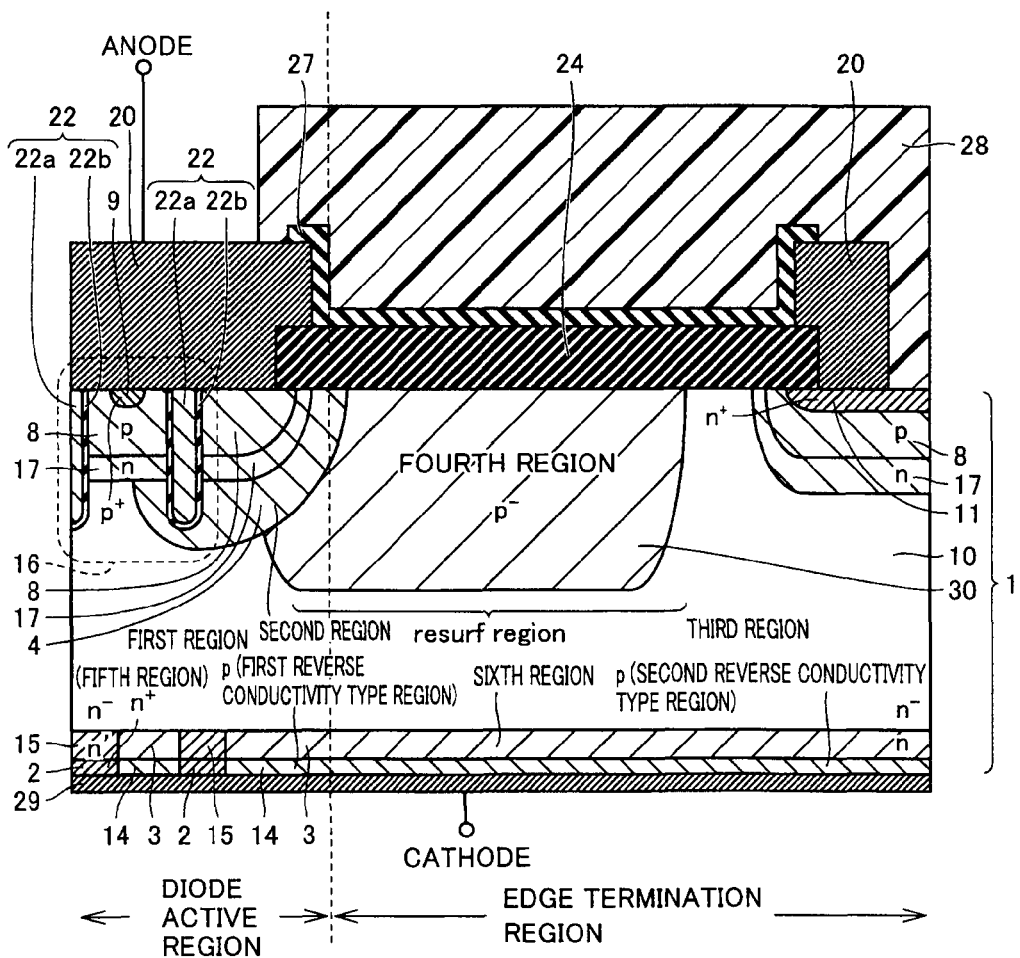
FIG. 46 is a schematic cross-sectional view of the semiconductor device according to Example 5 in the fourth embodiment.
Figure 47:
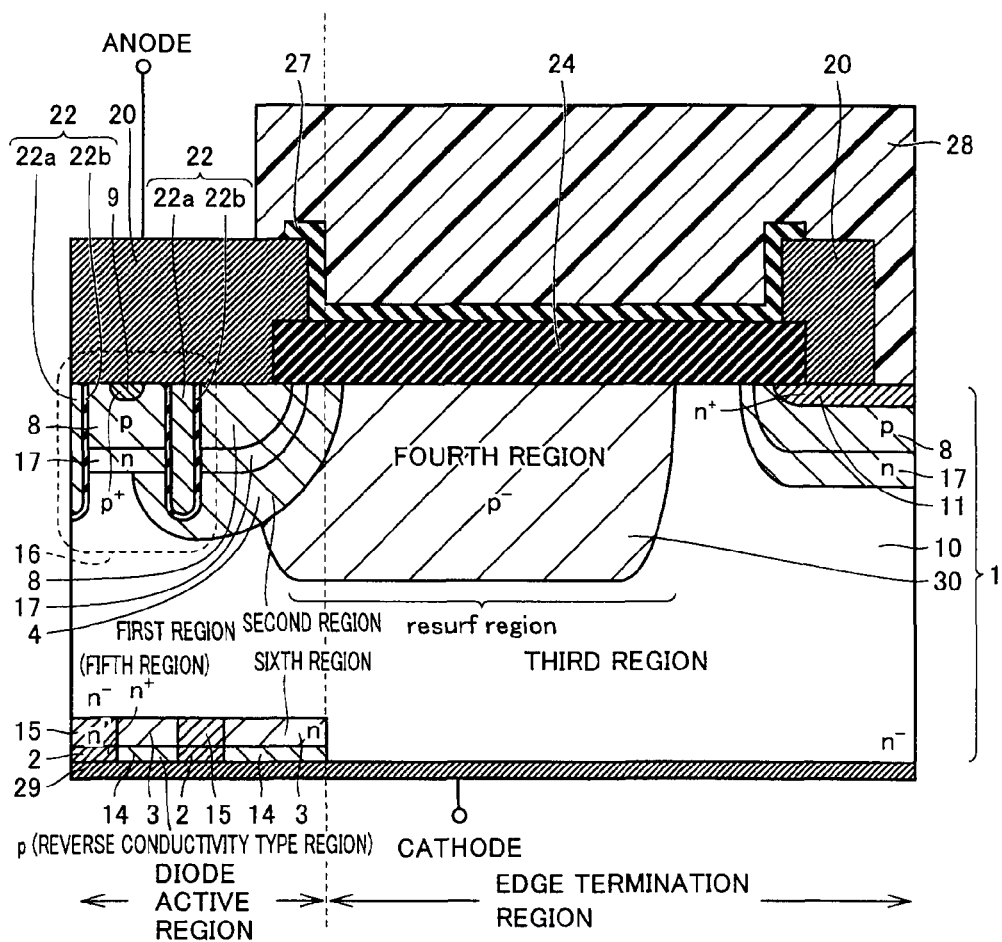
FIG. 47 is a schematic cross-sectional view of the semiconductor device according to Example 6 in the fourth embodiment.

It is to be noted that the configuration including n' layer 15 shown in FIG. 34 is combined with Example 2 shown in FIG. 7 of the first embodiment, which also allows the similar effects to be achieved though it is different in the cathode structure from Example 3 in the first embodiment. An example of the semiconductor device obtained by combining the configuration in FIG. 34 with Example 2 of the first embodiment is shown in FIG. 35 as Example 3 of the present embodiment.

Example 2 of the present invention is different from the first embodiment of the present invention only in each feature as described above. In other words, the configurations, conditions, procedures, effects and the like of the second embodiment according to the present invention that are not set forth above are assumed to be identical to those in the first embodiment of the present invention.

Third Embodiment

The semiconductor device according to the present embodiment is different in the configuration of the edge termination from the semiconductor device according to each of the first and second embodiments. The present embodiment will be hereinafter described.

Referring to FIGS. 36 to 41, the semiconductor device according to each of Examples 1 to 6 of the present embodiment is basically similar in configuration to the semiconductor device according to each Example of the first and second embodiments in FIGS. 15, 2, 7, 33, 34, and 35, respectively. It is to be noted that, on the anode side in the edge termination region in the semiconductor device according to each of Examples 1 to 6 of the present embodiment, a plurality of p-type regions 5 each as an edge termination are formed such that p-type regions 5 are arranged spaced apart from each other with respect to the first main surface of semiconductor substrate 1. The region having a plurality of edge terminations (guard ring) arranged spaced apart from each other is referred to as a multiple floating limiting ring region.

In each of FIGS. 36 to 41, three p-type regions 5 are formed. However, the number of p-type regions to be formed can be an arbitrary number that is varied depending on the breakdown voltage of the semiconductor device. Furthermore, the surface concentration of the p-type impurities in each p-type region 5 and the depth of each p-type region 5 from the first main surface of semiconductor substrate 1 are also varied depending on the breakdown voltage of the semiconductor device. In other words, the surface concentration of the p-type impurities and the depth in each p-type region 5 may be identical to or different from those in p-type region 4. It is preferable that the p-type impurity concentration (surface concentration) in p-type region 5 falls within a range of $1\times10^{16}$ to $1\times10^{19}$ cm$^{-3}$, and the depth of p-type region 5 falls within a range of 2.0 to 9.0 nm.

With regard to each p-type region 5 in FIGS. 36 to 41, the width of p-type region 5 in the direction along the first main surface and the distance between adjacent p-type regions 5 in the direction along the first main surface each may also be an optimum value depending on the breakdown voltage of each semiconductor device, the number of p-type regions 5, and the impurity concentration and depth of each p-type region 5. Therefore, depending on the conditions such as a breakdown voltage of the semiconductor device, p-type region 5 in the present embodiment may be configured to have a width that is approximately identical to that of p-type region 5 in the first embodiment.

The semiconductor devices in FIGS. 36 to 41 are approximately identical in configuration to the semiconductor devices in FIGS. 15, 2, 7, 33, 34, and 35, respectively (Examples 3, 1 and 2 in the first embodiment and Examples 1, 2 and 3 in the second embodiment, respectively). Accordingly, the components in FIGS. 36 to 41 identical to those in FIGS. 15, 2, 7, 33, 34, and 35, respectively, are designated by the same reference characters, and description thereof will not be repeated.

As described in the present embodiment, a plurality of (for example, three) p-type regions 5 each as a guard ring may be configured to be arranged as a multiple floating limiting ring region. Also in this case, as in the case of the semiconductor device shown in each of the first and second embodiments, it becomes possible to achieve effects such as an increase in the breakdown voltage during the recovery and suppression of the oscillation during the recovery without decreasing the current in the forward direction in the diode active region. Also in the present embodiment, as in the case of the semiconductor device shown in each of the first and second embodiments, the effect of expanding the SOA during the recovery can be achieved.

The third embodiment of the present invention is different from the first and second embodiments of the present invention only in each feature as described above. In other words, the configurations, conditions, procedures, effects and the like of the third embodiment of the present invention that are not set forth above are assumed to be identical to those in the first and second embodiments of the present invention.

Fourth Embodiment

The semiconductor device according to the present embodiment is different in the configuration of the edge termination from the semiconductor device according to the third embodiment. The present embodiment will be hereinafter described.

Referring to FIGS. 42 to 47, the semiconductor device according to each of Examples 1 to 6 of the present embodiment is basically similar in configuration to the semiconductor device according to each Example of the third embodiment in FIGS. 36 to 41, respectively. It is to be noted that, on the anode side in the edge termination region in the semiconductor device according to each of Examples 1 to 6 of the present embodiment, a p-type region 30 as a guard ring is formed over a wide range of the first main surface of semiconductor substrate 1. P-type region 30 is formed such that a part thereof extends into the diode active region and is brought into contact with p-type region 4. More specifically, p-type region 30 is formed such that it extends further into a region located deeper than p-type region 4 with respect to the first main surface and is brought into contact with the undersurface of p-type region 4. Accordingly, it is preferable that p-type region 30 is formed deeper than p-type region 4.

It is preferable that the p-type impurity concentration (surface concentration) in p-type region 30 is $1 \times 10^{15}$ cm$^{-3}$ or more and $1 \times 10^{17}$ cm$^{-3}$ or less, and is lower than the p-type impurity concentration (surface concentration) in p-type region 4. P-type region 30 as an edge termination in the present embodiment is formed as a so-called resurf region.

With regard to p-type region 30 in each of FIGS. 42 to 47, the width of each p-type region 30 in the direction along the first main surface (the ratio of the region having p-type region formed therein to the area of the first main surface) may be an optimum value depending on the breakdown voltage of each semiconductor device. Therefore, depending on the conditions such as a breakdown voltage of the semiconductor device, p-type region 5 in the present embodiment may be configured to have a width that is approximately identical to that of oxide film 24 as seen in plan view in each of FIGS. 42 to 47, for example.

The semiconductor device in each of FIGS. 42 to 47 is approximately identical in configuration to the semiconductor device according to the third embodiment shown in each of FIGS. 36 to 41 except for the above-described configuration. Accordingly, the components identical to those in the first to third embodiments are designated by the same reference characters in the present embodiment, and description thereof will not be repeated.

Also in the present embodiment, it becomes possible to achieve effects such as an increase in the breakdown voltage during the recovery and suppression of the oscillation during the recovery without decreasing the current in the forward direction in the diode active region. Furthermore, in the present embodiment, a depletion layer extends from the junction between p-type region 30 as a so-called resurf region and n$^-$ drift layer 10 toward inside of p-type region 30 and n$^-$ drift layer 10. When the depletion layer extends in the longitudinal direction in the figure and p-type region 30 is fully depleted, the electric field in the surface of p-type region 30 (surface electric field) is reduced. In the present embodiment, this reduction in the surface electric field allows more reliable suppression of the oscillation in the vicinity of p-type region 30 during the recovery. Furthermore, the present embodiment also allows the effect of expanding the SOA during the recovery to be achieved as in the case of the semiconductor device shown in each of the first and second embodiments.

The fourth embodiment of the present invention is different from the third embodiment of the present invention only in each feature as described above. In other words, the configurations, conditions, procedures, effects and the like of the fourth embodiment of the present invention that are not set forth above are assumed to be identical to those in the first to third embodiments of the present invention.

In the present embodiment, semiconductor substrate 1 is made of a single crystal of silicon. However, in the case where other semiconductor materials, for example, such as SiC, GaN, GaAs, and sapphire are used for semiconductor substrate 1, the effects similar to those obtained in the above-described embodiments can be achieved.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A semiconductor device comprising:
a semiconductor substrate having a first main surface and a second main surface facing each other, and a diode active region and an edge termination region adjacent to each other;
a first region of a first conductivity type formed in said diode active region and within said semiconductor substrate;
a second region of a second conductivity type formed on said first main surface of said semiconductor substrate to form a diode together with said first region in said diode active region;
a third region of the first conductivity type formed in said edge termination region and within said semiconductor substrate; and
a fourth region of the second conductivity type serving as an edge termination formed on said first main surface of said semiconductor substrate in said edge termination region,
said first region and said third region sharing a drift region of the first conductivity type forming a pn junction with said fourth region,
said first region and said third region being located on said second main surface and sharing a fifth region of the first conductivity type which is higher in concentration of first conductivity type impurities than said drift region,
said first region and said third region being extended from said first main surface to a sixth region, and
said drift region in said third region being greater in number of crystal defects per unit volume than said drift region in said first region in order that said drift region in said third region is shorter in carrier lifetime than said drift region in said first region.

2. The semiconductor device according to claim 1, wherein an average value of said carrier lifetime in said edge termination region is 1.0 μsec or less.

3. The semiconductor device according to claim 1, wherein said first region and said third region share the sixth region of the first conductivity type, which is located between said drift region and said fifth region, and
the sixth region is lower in concentration of the first conductivity type impurities than said fifth region and higher in concentration of the first conductivity type impurities than said drift region.

4. The semiconductor device according to claim 1, wherein said fourth region has a plurality of second conductivity type regions formed spaced apart from each other on said first main surface.

5. The semiconductor device according to claim 1, wherein said fourth region is formed so as to be in contact with said second region.

6. The semiconductor device according to claim 5, wherein said fourth region is lower in concentration of second conductivity type impurities than said second region.

7. A semiconductor device comprising:
a semiconductor substrate having a first main surface and a second main surface facing each other, and a diode active region and an edge termination region adjacent to each other;

a first region of a first conductivity type formed in said diode active region and within said semiconductor substrate;

a second region of a second conductivity type formed on said first main surface of said semiconductor substrate to form a diode together with said first region in said diode active region;

a third region of the first conductivity type formed in said edge termination region and within said semiconductor substrate; and a fourth region of the second conductivity type serving as an edge termination formed on said first main surface of said semiconductor substrate in said edge termination region, said first region and said third region sharing a drift region of the first conductivity type forming a pn junction with said fourth region, said first region having a fifth region of the first conductivity type which is higher in concentration of first conductivity type impurities than said drift region, said fifth region being located only within said first region, and said edge termination region having said drift region formed on said second main surface and said diode active region having said fifth region formed on said second main surface.

8. The semiconductor device according to claim 7, further comprising:

a reverse conductivity type region of the second conductivity type formed adjacent to said fifth region on said second main surface of said diode active region, wherein said first region has a sixth region of the first conductivity type which is located between said drift region and said fifth region, said sixth region is lower in concentration of the first conductivity type impurities than said fifth region and higher in concentration of the first conductivity type impurities than said drift region.

9. The semiconductor device according to claim 8, wherein a region of said sixth region located directly above said fifth region is different in concentration of the first conductivity type impurities from a region of said sixth region located directly above said reverse conductivity type region.

10. The semiconductor device according to claim 8, wherein a ratio of an area of said reverse conductivity type region to a total area of said diode active region in said second main surface is 20% or more and 95% or less.

11. A semiconductor device comprising:

a semiconductor substrate having a first main surface and a second main surface facing each other, and a diode active region and an edge termination region adjacent to each other;

a first region of a first conductivity type formed in said diode active region and within said semiconductor substrate;

a second region of a second conductivity type formed on said first main surface of said semiconductor substrate to form a diode together with said first region in said diode active region;

a third region of the first conductivity type formed in said edge termination region and within said semiconductor substrate;

a fourth region of the second conductivity type serving as an edge termination formed on said first main surface of said semiconductor substrate in said edge termination region;

a first reverse conductivity type region of the second conductivity type formed adjacent to a fifth region on said second main surface of said diode active region; and a second reverse conductivity type region of the second conductivity type formed on said second main surface of said edge termination region, wherein said first region and said third region sharing a drift region of the first conductivity type forming a pn junction with said fourth region, said first region comprising the fifth region which is higher in concentration of first conductivity type impurities than said drift region, said first region and said third region sharing a sixth region of the first conductivity type which is lower in concentration of the first conductivity type impurities than said fifth region and higher in concentration of the first conductivity type impurities than said drift region, and said sixth region being located between said drift region and said fifth region, said first reverse conductivity type region in said diode active region and located between said second reverse conductivity type region and said drift region in said edge termination region.

12. The semiconductor device according to claim 11, wherein a ratio of an area of said first reverse conductivity type region to a total area of said diode active region in said second main surface is 20% or more and 95% or less.

* * * * *